(12) United States Patent
Kobata et al.

(10) Patent No.: US 12,154,797 B2
(45) Date of Patent: Nov. 26, 2024

(54) SUBSTRATE PROCESSING METHOD AND SUBSTRATE PROCESSING APPARATUS

(71) Applicant: EBARA CORPORATION, Tokyo (JP)

(72) Inventors: Itsuki Kobata, Tokyo (JP); Yosuke Himori, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 17/878,840

(22) Filed: Aug. 1, 2022

(65) Prior Publication Data

US 2023/0038445 A1 Feb. 9, 2023

(30) Foreign Application Priority Data

Aug. 4, 2021 (JP) .................. 2021-128534

(51) Int. Cl.
*H01L 21/02* (2006.01)
*H01L 21/67* (2006.01)
*H01L 21/677* (2006.01)

(52) U.S. Cl.
CPC .. *H01L 21/67051* (2013.01); *H01L 21/67034* (2013.01); *H01L 21/67057* (2013.01); *H01L 21/67109* (2013.01); *H01L 21/67219* (2013.01); *H01L 21/67742* (2013.01)

(58) Field of Classification Search
None
See application file for complete search history.

(56) References Cited

U.S. PATENT DOCUMENTS

| 2004/0253833 | A1* | 12/2004 | Takehiko | .......... H01L 21/67051 438/782 |
| 2007/0084481 | A1* | 4/2007 | Franklin | .................. B08B 3/12 134/1 |
| 2020/0294821 | A1* | 9/2020 | Wu | ........................ B08B 3/041 |
| 2021/0268397 | A1* | 9/2021 | Imanaka | ............. B01D 1/0017 |

FOREIGN PATENT DOCUMENTS

| JP | 2005-268287 A | 9/2005 |
| JP | 2009170709 | * 7/2009 |
| JP | 2012106149 | * 6/2012 |

OTHER PUBLICATIONS

Translation of JP2009170709 by Hirose, published Jul. 30, 2009.*
Translation of JP2012106149 by Hirose, published Jun. 7, 2012.*

* cited by examiner

*Primary Examiner* — Mikhail Kornakov
*Assistant Examiner* — Ryan L Coleman
(74) *Attorney, Agent, or Firm* — BakerHostetler

(57) ABSTRACT

A substrate processing method capable of suppressing corrosion of a conductive material on a surface of a substrate by supplying a liquid having a reduced concentration of dissolved oxygen onto the substrate. The substrate processing method includes: dissolving an inert gas in a liquid at not less than a saturation solubility to replace oxygen dissolved in the liquid with the inert gas; generating bubbles of the inert gas in the liquid by depressurizing the liquid in which the inert gas is dissolved; and processing the substrate while supplying the liquid containing the bubbles to the surface of the substrate.

10 Claims, 12 Drawing Sheets

FIG. 5

| SOLUBILITY OF GAS | | | | | | | |
|---|---|---|---|---|---|---|---|
| GAS | CHEMICAL FORMULA | 0°C | 20°C | 40°C | 60°C | 80°C | 100°C |
| OXYGEN | $O_2$ | 0.049 | 0.031 | 0.023 | 0.019 | 0.018 | 0.017 |
| NITROGEN | $N_2$ | 0.024 | 0.016 | 0.012 | 0.010 | 0.0096 | 0.0095 |
| HELIUM | He | 0.0093 | 0.0088 | 0.0084 | 0.0092 | 0.0101 | 0.0114 |
| NEON | Ne | 0.013 | 0.0104 | 0.0095 | 0.0094 | 0.0103 | 0.0115 |
| ARGON | Ar | 0.053 | 0.035 | 0.027 | 0.021 | 0.019 | 0.019 |
| VOLUME($cm^3$) OF GAS DISSOLVED IN WATER OF 1 $cm^3$ UNDER 1 atm | | | | | | | |

SUBSTRATE PROCESSING METHOD AND SUBSTRATE PROCESSING APPARATUS

CROSS REFERENCE TO RELATED APPLICATION

This document claims priority to Japanese Patent Application No. 2021-128534 filed Aug. 4, 2021, the entire contents of which are hereby incorporated by reference.

BACKGROUND

Precision required for a respective process in manufacturing of semiconductor devices these days has already reached the order of several nm. It is expected that the precision on the order of Angstrom will be required in the future. In chemical mechanical polishing (CMP), it is also required to maintain dimensions of elements and interconnects on the order of several nm over an entire surface of a wafer, and this requirement is expected to be on the order of Angstrom in the future. This is because changes in the dimensions of elements and interconnects affect a drive performance (a drive voltage and a current amount) of a device.

Therefore, during chemical mechanical polishing (CMP), it is required not only to suppress dishing and erosion, but also to prevent corrosions of device forming materials, particularly conductive materials used in via-contacts and interconnects, in a cleaning process after polishing, in addition to removing slurry and polishing debris from a substrate surface. Examples of the conductive materials as objects of CMP include typical metal materials for interconnects, such as tungsten (W) and copper (Cu), and barrier metals, such as tantalum/tantalum nitride (Ta/TaN) and titanium/titanium nitride (Ti/TiN). Recently, in addition to these materials, a wide variety of conductive materials, such as cobalt (Co), ruthenium (Ru), molybdenum (Mo), carbon nanotube (CNT), and graphene are used for semiconductor devices. Depending on materials, for example, a pH range in which corrosion occurs may be wider than that of conventional Cu and W, and the requirement for corrosion prevention is becoming more stringent.

Typical modes of interconnect corrosion that can occur during the CMP and the substrate cleaning include chemical corrosion due to a chemical reaction between an etchant in a liquid and a conductive material, galvanic corrosion caused by an electromotive force generated between different types of conductive materials electrically connected in a liquid, photo-corrosion caused by an electromotive force generated when light is applied to a certain device, such as P/N junction, and corrosion due to static electrical charge generated by friction between a polishing pad and a substrate surface or generated in a substrate due to propagation of static electricity generated in an apparatus. In either corrosion mode, an etchant component that exists in a liquid (e.g., slurry, cleaning liquid, or rinsing water) contributes to the corrosion. Typical examples of the etchant component include pH adjuster, oxidizing agent, and chelating agent in slurry or cleaning liquid. Furthermore, oxygen existing in a cleaning module or a substrate transporter can be the etchant. This is because oxygen dissolved in cleaning liquid or rinsing water directly or in combination with the etchant component of the slurry or the cleaning liquid contributes to further promotion of corrosion of the conductive material.

One conventional solution for suppressing the corrosion is to add to the slurry and the cleaning liquid a corrosion inhibitor or a component forming a protective film, such as an oxide film, on a surface of a conductive material together with these components. On the other hand, regarding the removal of the oxygen atmosphere, ultrapure water normally used for semiconductor cleaning is supplied to a cleaning module in a state where dissolved oxygen has been forcibly removed from the ultrapure water by deaeration or the like. However, the oxygen in the atmosphere dissolves in the ultrapure water very easily and returns to a dissolved oxygen level before the deaeration in a very short time. Therefore, normally, the atmosphere in the cleaning module is purged with an inert gas, such as $N_2$ gas, so that the concentration of oxygen in the atmosphere is lowered, and the amount of oxygen dissolved in the cleaning liquid or the rinsing water on the substrate is reduced.

However, the above method using the inert gas incurs an increase in manufacturing cost due to consumption of a large amount of the inert gas depending on a target area to be purged. In addition, if the area to be purged is large, or if a completely enclosed space cannot be formed due to structures, the concentration of oxygen may not be sufficiently reduced. In that case, there is also a solution that physically limits the area to be purged with a plate or the like only in the vicinity of the substrate. However, since this plate interferes with other cleaning mechanisms and hinders the cleaning operation, mounting of other cleaning mechanisms is restricted. This will prevent an improvement of cleaning performance. Therefore, in order to suppress the chemical corrosion due to the oxygen atmosphere in the cleaning process, a method capable of sufficiently reducing the concentration of oxygen with low cost while maintaining or improving the cleaning performance is required.

Japanese laid-open patent publication No. 2005-268287 discloses a cleaning device using rinsing water in which nitrogen of a saturated concentration or higher is dissolved. Since this rinsing water contains almost no oxygen, it is expected to prevent corrosion of a conductive material on a substrate surface. However, for the purpose of preventing generation of bubbles in the rinsing water, the rinsing water containing the nitrogen dissolved therein is supplied to the substrate surface after the deaeration. Accordingly, the oxygen in the surrounding atmosphere is easily dissolved in the deaerated rinsing water. As a result, the suppression of corrosion of the conductive material on the surface of the substrate may be insufficient.

SUMMARY

Therefore, there are provided a substrate processing method and a substrate processing apparatus capable of suppressing corrosion of a conductive material on a surface of a substrate by supplying a liquid having a reduced concentration of dissolved oxygen onto the substrate.

Embodiments, which will be described below, relate to a substrate processing method and a substrate processing apparatus for processing a substrate, such as a wafer, a PCB wiring substrate, a printed wiring substrate, or a square substrate, and more particularly a substrate processing method and a substrate processing apparatus for processing a substrate while suppressing corrosion of a conductive material exposed on a surface of the substrate.

In an embodiment, there is provided a substrate processing method of processing a substrate having a conductive material exposed on a surface of the substrate, comprising: dissolving an inert gas in a liquid at not less than a saturation solubility to replace oxygen dissolved in the liquid with the inert gas; generating bubbles of the inert gas in the liquid by depressurizing the liquid in which the inert gas is dissolved;

and processing the substrate while supplying the liquid containing the bubbles to the surface of the substrate.

In an embodiment, diameters of the bubbles are not more than 1 μm.

In an embodiment, the saturation solubility of the inert gas is a saturation solubility under conditions of a temperature of 20° C. and 1 atm.

In an embodiment, the substrate processing method further comprises deaerating the liquid before dissolving the inert gas in the liquid.

In an embodiment, the substrate processing method further comprises cooling the liquid before dissolving the inert gas in the liquid.

In an embodiment, the temperature of the cooled liquid is in a range of 5° C. to 20° C.

In an embodiment, the substrate processing method further comprises repeating the process of dissolving the inert gas in the liquid at not less than the saturation solubility and the process of generating the bubbles of the inert gas in the liquid while circulating the liquid via a liquid tank.

In an embodiment, the inert gas is a nitrogen gas or a noble gas.

In an embodiment, the liquid is pure water or chemical liquid.

In an embodiment, the substrate processing method further comprises supplying the liquid containing the bubbles to the surface of the substrate when the substrate is being transported.

In an embodiment, processing of the substrate is a cleaning process of the substrate which is performed in a cleaning device; the substrate is transported into the cleaning device with the liquid containing the bubbles existing on the surface of the substrate; and the cleaned substrate is removed from the cleaning device while the cleaned substrate is in a wet state.

In an embodiment, processing of the substrate is a cleaning process of the substrate; the substrate processing method further comprises drying the cleaned substrate in a drying device; the substrate is transported into the drying device with the liquid containing the bubbles existing on the surface of the substrate; and the dried substrate is removed from the drying device while the dried substrate is in a dried state.

In an embodiment, processing of the substrate is a cleaning process of the substrate; the substrate processing method further comprises polishing the substrate by rubbing the substrate against a polishing surface while supplying a polishing liquid onto the polishing surface; and the cleaning process is performed after polishing of the substrate.

In an embodiment, there is provided a substrate processing apparatus for processing a substrate having a conductive material exposed on a surface of the substrate, comprising: an inert-gas dissolving device configured to dissolve an inert gas in a liquid at not less than a saturation solubility to replace oxygen dissolved in the liquid with the inert gas; a bubble generating device configured to generate bubbles of the inert gas in the liquid by depressurizing the liquid in which the inert gas is dissolved; a processing module configured to process the substrate while supplying the liquid containing the bubbles to the surface of the substrate; and an inert-gas-dissolved liquid supply line arranged to deliver the liquid containing the bubbles to the processing module.

In an embodiment, the bubble generating device is configured to generate the bubbles having diameters of not more than 1 μm.

In an embodiment, the saturation solubility of the inert gas is a saturation solubility under conditions of a temperature of 20° C. and 1 atm.

In an embodiment, the substrate processing apparatus further comprises a deaeration device configured to deaerate the liquid before the inert gas is dissolved in the liquid.

In an embodiment, the substrate processing apparatus further comprises a liquid cooling device configured to cool the liquid before the inert gas is dissolved in the liquid.

In an embodiment, the liquid cooling device is configured to cool the liquid, before the inert gas is dissolved in the liquid, to a temperature in a range of 5° C. to 20° C.

In an embodiment, the substrate processing apparatus further comprises: a liquid tank located upstream of the inert-gas dissolving device; a pump configured to deliver the liquid stored in the liquid tank to the inert-gas dissolving device; and a circulation line extending from a position downstream of the bubble generating device to the liquid tank and arranged to return the liquid containing the bubbles to the liquid tank.

In an embodiment, the inert gas is a nitrogen gas or a noble gas.

In an embodiment, the liquid is pure water or chemical liquid.

In an embodiment, the substrate processing apparatus further comprises: a substrate transporting device configured to transport the substrate, the substrate transporting device including: a robot hand configured to support the substrate; and a shower nozzle arranged above the robot hand and coupled to the inert-gas-dissolved liquid supply line.

In an embodiment, the substrate processing apparatus further comprises a CMP device configured to polish the substrate by rubbing the substrate against a polishing surface while supplying a polishing liquid onto the polishing surface, wherein the processing module is a cleaning device configured to clean the substrate after a polishing operation of the CMP device.

In an embodiment, there is provided a computer-readable storage medium storing therein a program for causing a computer to instruct a substrate processing apparatus to perform the substrate processing method.

According to the above-described embodiments, the inert gas is dissolved in the liquid at not less that the saturation solubility, and bubbles of the inert gas are present even after the supply of the liquid, so that the concentration of oxygen in the liquid is maintained at a very small level. Therefore, corrosion of the conductive material due to the oxygen can be suppressed. Furthermore, since structures for purging the oxygen in the ambient atmosphere by an inert gas, such as nitrogen gas, can be omitted, the amount of the inert gas used can be reduced and the manufacturing cost can be reduced.

BRIEF DESCRIPTION OF THE DRAWINGS

FIG. 5 is a table showing solubilities of oxygen and typical inert gases;

DESCRIPTION OF EMBODIMENTS

Hereinafter, embodiments will be described with reference to the drawings.

Figure 1:
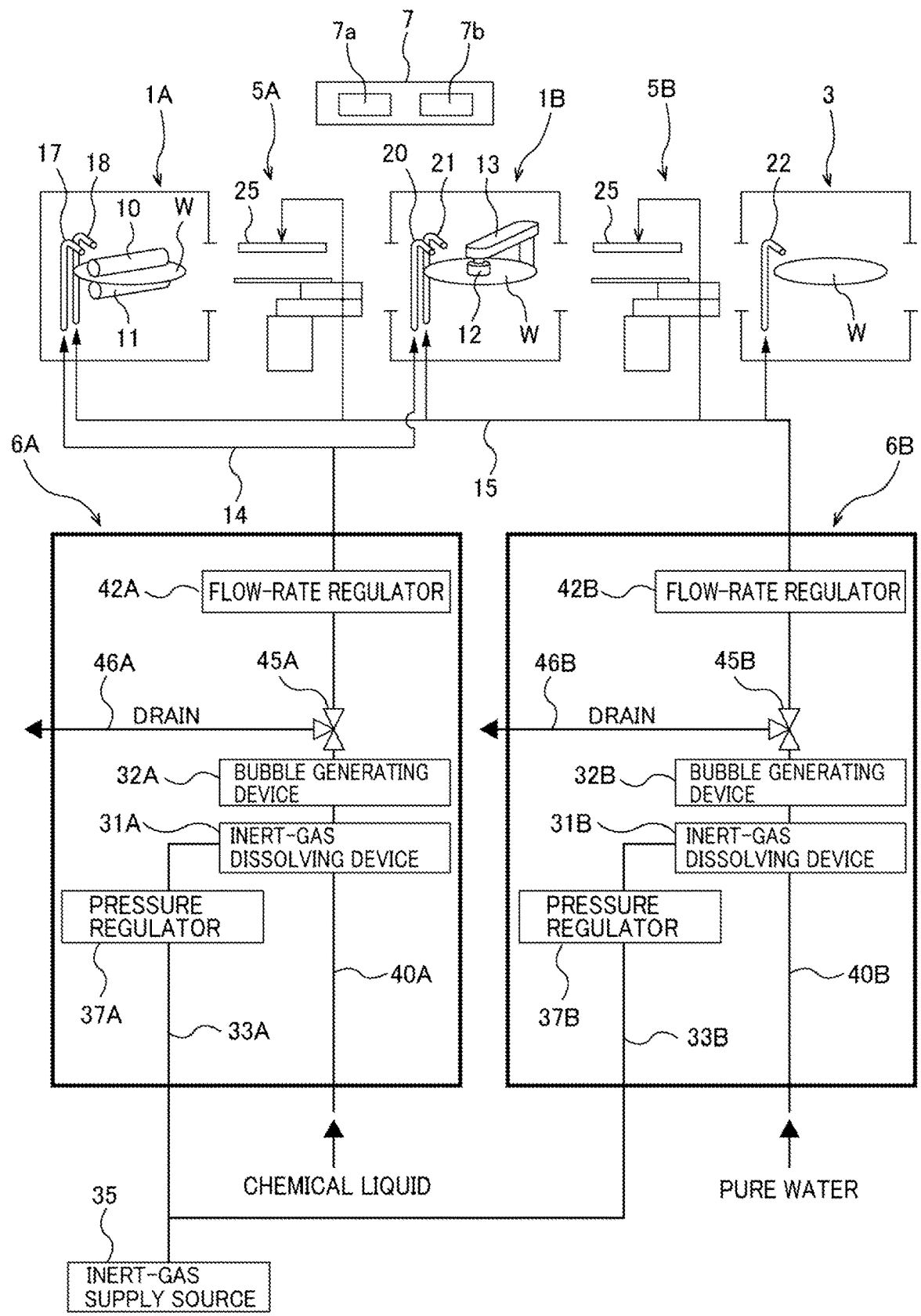
FIG. 1 is a schematic view showing an embodiment of a substrate processing apparatus.

FIG. 1 is a schematic view showing an embodiment of a substrate processing apparatus. The substrate processing apparatus of the present embodiment is an apparatus for cleaning and drying a substrate, such as a wafer, a PCB wiring substrate, a printed wiring substrate, or a square substrate, used for manufacturing of semiconductor devices. A typical example of the substrate is a circular wafer. The substrate used in embodiments described below is circular, but the shape of the substrate to be processed is not limited to a circular shape, and may have other shape (for example, a rectangular shape or a polygonal shape). The substrate to be cleaned is, for example, a substrate that has been polished by a CMP (chemical mechanical polishing) apparatus.

The substrate to be processed has a conductive material exposed on its surface. The conductive material may be an interconnect, a contact, a plug, or the like that constitutes a semiconductor device. Examples of the conductive material include metal materials, such as tungsten (W), copper (Cu), tantalum/tantalum nitride (Ta/TaN), titanium/titanium nitride (Ti/TiN), cobalt (Co), ruthenium (Ru), and molybdenum (Mo). In addition to these metal materials, carbon nanotube (CNT) or graphene may be exposed on the surface of the substrate. The substrate processing apparatus according to the embodiments described below is used for cleaning and drying the surface of the substrate while suppressing corrosion of the conductive material exposed on the surface of the substrate due to oxygen.

As shown in FIG. 1, the substrate processing apparatus of the present embodiment includes two cleaning devices 1A and 1B each for cleaning a surface of a substrate W, a drying device 3 for drying the cleaned substrate W, a substrate transporting device 5A for transporting the substrate W between the cleaning device 1A and the cleaning device 1B, a substrate transporting device 5B for transporting the substrate W between the cleaning device 1B and the drying device 3, liquid supply devices 6A and 6B for supplying at least one of pure water and a chemical liquid to the cleaning device 1A and 1B and the drying device 3, and an operation controller 7 for controlling operations of the substrate processing apparatus.

The cleaning devices 1A and 1B and the drying device 3 are examples of processing modules for processing the substrate W. In the embodiment shown in FIG. 1, two cleaning devices 1A and 1B are provided, but the number of cleaning devices is not limited to this embodiment, and only one cleaning device may be provided, or three or more cleaning devices may be provided. The chemical liquid used in the present embodiment is a chemical liquid for cleaning the substrate W, and may be a mixture of a cleaning component (e.g., a chelating agent) and a pH adjuster contained in pure water. Alternatively, in one embodiment, electrolytic ionized water, diluted hydrochloric acid water, or ammonia water may be used.

The operation controller 7 is composed of at least one computer. The operation controller 7 includes a memory 7a storing programs therein and an arithmetic device 7b configured to perform arithmetic operations according to instructions included in the programs. The memory 7a includes a main memory, such as a random-access memory (RAM), and an auxiliary memory, such as a hard disk drive (HDD) or a solid-state drive (SSD). Examples of the arithmetic device 7b include a CPU (central processing unit) and a GPU (graphic processing unit). However, the specific configurations of the operation controller 7 is not limited to this embodiment.

In one embodiment, the operation controller 7 has a memory storing the programs, a CPU (Central Processing Unit) for executing the programs in the memory, and a control module realized by the CPU executing the programs. The control module or the controller is configured to be able to communicate with a superior controller (not shown) that controls the substrate processing apparatus and other related devices in an integrated manner, and can exchange data with a database of the superior controller. A storage medium constituting the memory stores various programs, such as various setting data and processing programs. The storage medium to be used may be a known storage medium, examples of which include memory, such as computer-readable ROM or RAM, and disc-shaped or stick-shaped storage medium, such as hard disk, CD-ROM, DVD-ROM, and flexible disk that can be freely inserted and removed.

In the following descriptions, the two cleaning devices 1A and 1B may be referred to as a primary cleaning device 1A and a secondary cleaning device 1B. Each of the primary cleaning device 1A and the secondary cleaning device 1B is configured to clean the surface of the substrate W by rubbing a cleaning tool against the surface of the substrate W in the presence of the liquid on the substrate W. More specifically, the primary cleaning device 1A is a roll-type cleaning device configured to scrub and clean both sides of the substrate W by pressing cylindrical roll cleaning tools 10 and 11 against both sides of the substrate W while holding and rotating the substrate W by a substrate holder (not shown) and rotating the roll cleaning tools 10 and 11. The secondary cleaning device 1B is a pen-type cleaning device configured to scrub and clean the surface (upper surface) of the substrate W by pressing a pen-shaped cleaning tool 12 against the surface (upper surface) of the substrate W while holding and rotating the substrate W by a substrate holder (not shown) and rotating the pen-shaped cleaning tool 12.

Specific examples of the substrate holder (not shown) described above include a substrate holder having a plurality of roller chucks configured to contact a peripheral edge of the substrate W. The pen-shaped cleaning tool 12 is rotatably coupled to a distal end of an oscillation arm 13, and the pen-shaped cleaning tool 12 scans the surface (upper surface) of the substrate W in a radial direction of the substrate W as the oscillation arm 13 oscillates. It is noted, however, the specific configurations of the cleaning devices 1A and 1B are not limited to this embodiment. For example, the cleaning devices 1A and 1B may be the same type of cleaning device, or the cleaning devices 1A and 1B may be a type of cleaning device other than the roll-type cleaning device and the pen-type cleaning device.

Examples of the cleaning tool include a PVA sponge. In one embodiment, a cleaning device of a type including a pen-type cleaning device for the front side of the substrate and a roll-type cleaning device for the back side of the substrate may be used. Alternatively, for example, in one embodiment, a two-fluid jet (2FJ) may be used for the primary cleaning device 1A or the secondary cleaning device 1B. A rinsing liquid to be used in the two-fluid jet cleaning process may be a liquid containing bubbles that have been generated by reducing pressure of the liquid in which an inert gas is dissolved, which will be discussed later. When the surface of the substrate is polished, a concave dishing or erosion may be formed on the surface of the substrate. Particles existing in this dishing are generally difficult to be removed by a scrubbing cleaning process. It is known that the two-fluid jet cleaning is effective, but on the other hand, it is expected that corrosion should be suppressed during the two-fluid jet cleaning process. In such a case, the rinsing liquid containing the bubbles generated therein is used.

In this embodiment, the two substrate transporting devices 5A and 5B are provided. However, the number of substrate transporting devices can change depending on the number of cleaning devices, and therefore the number of substrate transporting devices is not limited to this embodiment. As shown in FIG. 1, the primary cleaning device 1A, the secondary cleaning device 1B, and the drying device 3 are arranged in line. The substrate transporting device 5A is located between the primary cleaning device 1A and the secondary cleaning device 1B. The substrate transporting device 5B is arranged between the secondary cleaning device 1B and the drying device 3.

In the present embodiment, the drying device 3 is an IPA drying device configured to dry the substrate W by supplying pure water and IPA vapor (a mixture of isopropyl alcohol and an inert gas) from a pure-water supply nozzle and an IPA supply nozzle to the upper surface of the substrate W while moving the pure-water supply nozzle and the IPA supply nozzle in the radial direction of the substrate W. In one embodiment, the drying device 3 may be a spin-drying device configured to rotate the substrate W at a high speed after supplying rinsing water constituted of pure water to the substrate W.

In this embodiment, the two liquid supply devices 6A and 6B are provided. In the following descriptions, the two liquid supply devices 6A and 6B may be referred to as first liquid supply device 6A and second liquid supply device 6B. As will be described later, the first liquid supply device 6A is configured to generate a chemical liquid in which an inert gas is dissolved at not less than a saturation solubility, and the second liquid supply device 6B is configured to generate pure water in which an inert gas is dissolved at not less than a saturation solubility.

The first liquid supply device 6A is configured to supply the chemical liquid in which the inert gas is dissolved to the primary cleaning device 1A and the secondary cleaning device 1B through a first inert-gas-dissolved liquid supply line 14. The second liquid supply device 6B is configured to supply the pure water in which the inert gas is dissolved to the primary cleaning device 1A, the secondary cleaning device 1B, the substrate transporting devices 5A, 5B, and the drying device 3 through a second inert-gas-dissolved liquid supply line 15. The reason for supplying the pure water containing the inert gas dissolved therein to the substrate transporting devices 5A and 5B is to suppress corrosion of a conductive material of the substrate W due to oxygen in the surrounding atmosphere during the transporting of the substrate W by supplying the pure water in which the inert gas is dissolved onto the substrate W.

The primary cleaning device 1A includes a chemical-liquid supply nozzle 17 configured to supply the chemical liquid in which the inert gas is dissolved to the surface of the substrate W, and a pure-water supply nozzle 18 configured to supply the pure water in which the inert gas is dissolved to the surface of the substrate W. The secondary cleaning device 1B also includes a chemical-liquid supply nozzle 20 configured to supply the chemical liquid in which the inert gas is dissolved to the surface of the substrate W, and a pure-water supply nozzle 21 configured to supply the pure water in which the inert gas is dissolved to the surface of the substrate W. The drying device 3 includes a pure-water supply nozzle 22 configured to supply the pure water in which the inert gas is dissolved to the surface of the substrate W. Further, each of the substrate transporting device 5A and the substrate transporting device 5B includes a shower nozzle 25 configured to supply the pure water in which the inert gas is dissolved to the surface of the substrate W.

Figure 2:
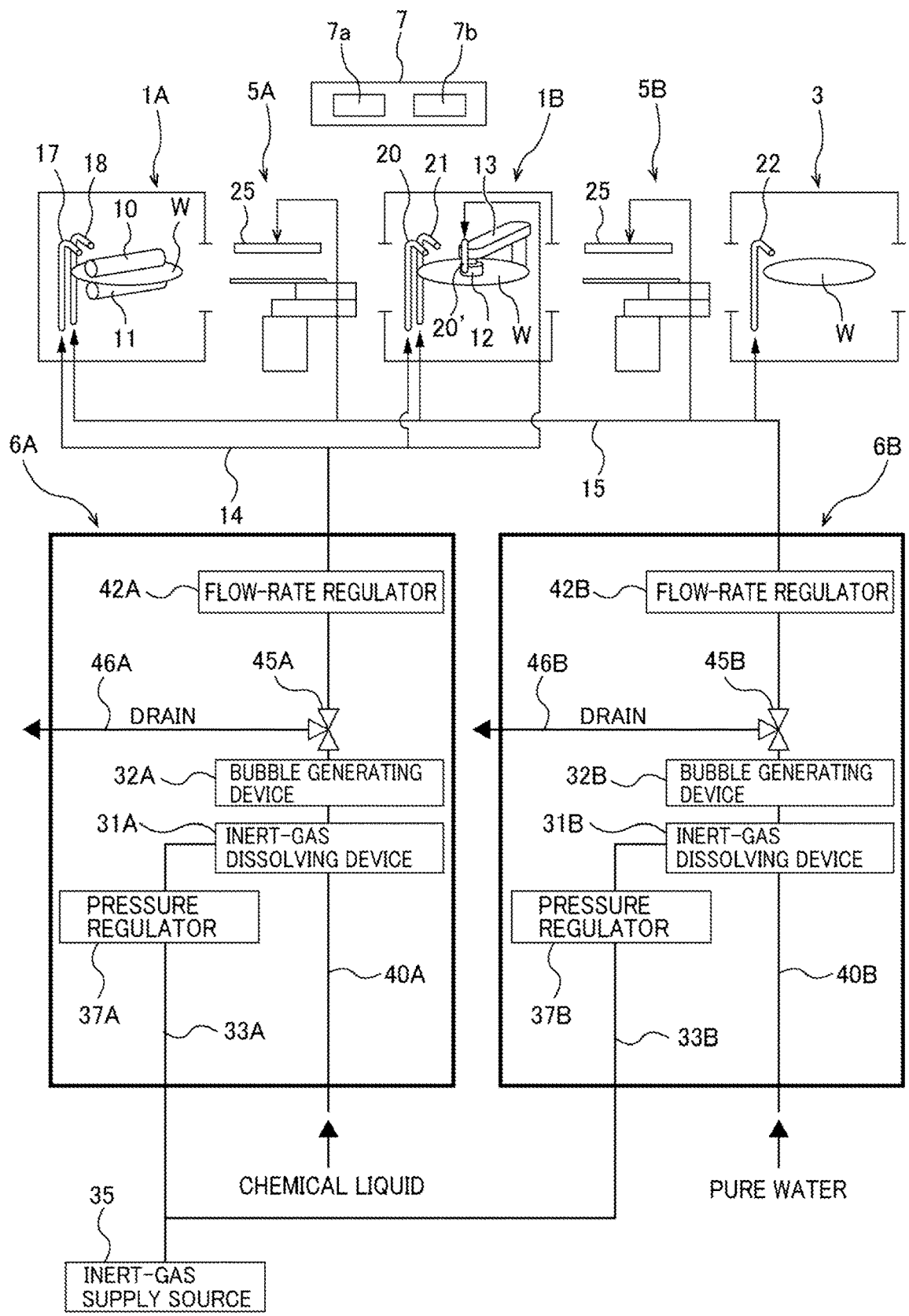
FIG. 2 is a schematic view showing another embodiment of the substrate processing apparatus.

In one embodiment, the chemical-liquid supply nozzle 17, the pure-water supply nozzle 18, the chemical-liquid supply nozzle 20, the pure-water supply nozzle 21, and the pure-water supply nozzle 22 are fixed in position relative to the substrate W. In another embodiment, as shown in FIG. 2, in addition to the chemical-liquid supply nozzle 20, a chemical-liquid supply nozzle 20' may be provided on the distal end of the oscillation arm 13 which is used when the surface of the substrate W is scrubbed with the pen-shaped cleaning tool 12. A chemical-liquid supply path to the chemical-liquid supply nozzle 20 is branched off such that a part of the chemical liquid in which the inert gas is dissolved can be supplied to the chemical-liquid supply nozzle 20'. The chemical-liquid supply nozzle 20' is moved together with the pen-shaped cleaning tool 12 over the upper surface of the substrate W, so that a liquid-contact position of the chemical liquid in which the inert gas is dissolved on the upper surface of the substrate W is moved within the surface of the substrate W. The chemical-liquid supply nozzle 20' shown in FIG. 2 is applicable to embodiments described below as well.

The substrate W is processed as follows. The substrate W, with its exposed surface of the conductive material facing upward, is transported into the primary cleaning device 1A by the substrate transporting device 5A. More specifically, the pure water in which the inert gas is dissolved (including bubbles of the inert gas) is supplied from the shower nozzle 25 of the substrate transporting device 5A to the surface (upper surface) of the substrate W and a film of pure water is formed on the substrate W. The substrate W, with the pure water containing gas bubbles existing on the surface thereof, is then carried into the primary cleaning device 1A by the substrate transporting device 5A. Detailed configurations of the substrate transporting device 5A will be described later. The primary cleaning device 1A scrubs and cleans both side surfaces of the substrate W with the roll cleaning tools 10 and 11 while supplying the chemical liquid that has been supplied from the first liquid supply device 6A and the pure water that has been supplied from the second liquid supply device 6B to both side surfaces of the substrate W. Both the chemical liquid and the pure water are liquids containing bubbles of the inert gas. Timings of supplying the chemical liquid and the pure water are not particularly limited. The pure water may be supplied as rinsing water after the chemical liquid is supplied.

The substrate W that has been cleaned by the primary cleaning device 1A is removed from the primary cleaning device 1A by the substrate transporting device 5A while the substrate W is in a wet state, and further transported to the secondary cleaning device 1B by the substrate transporting device 5A. During the transporting of the substrate W from the primary cleaning device 1A to the secondary cleaning device 1B, the pure water in which the inert gas is dissolved (including bubbles of the inert gas) is supplied onto the substrate W from the shower nozzle 25 of the substrate transporting device 5A. A film of the pure water is formed on the substrate W. The substrate W, with the pure water containing gas bubbles present on the surface thereof, is carried into the secondary cleaning device 1B by the substrate transporting device 5A. The secondary cleaning device 1B scrubs and cleans the surface (upper surface) of the substrate W with the pen-shaped cleaning tool 12 while supplying the chemical liquid that has been supplied from the first liquid supply device 6A and supplying the pure water that has been supplied from the second liquid supply device 6B to the surface (upper surface) of the substrate W. Both the chemical liquid and the pure water are liquids containing bubbles of the inert gas.

The substrate W that has been cleaned by the secondary cleaning device 1B is removed from the secondary cleaning device 1B by the substrate transporting device 5B while the substrate W is in a wet state, and is further transported to the drying device 3. During the transporting of the substrate W from the secondary cleaning device 1B to the drying device 3, the pure water (containing bubbles of the inert gas) in which the inert gas is dissolved is supplied onto the substrate W from the shower nozzle 25 of the substrate transporting device 5B. A film of the pure water is formed on the substrate W. The substrate W, with the pure water containing gas bubbles present on the surface thereof, is carried into the drying device 3 by the substrate transport device 5B. The drying device 3 dries the substrate W by supplying the pure water and IPA vapor (a mixture of isopropyl alcohol and an inert gas) from the pure-water supply nozzle 22 and the IPA supply nozzle (not shown) to the upper surface of the substrate W while moving the pure-water supply nozzle 22 and the IPA supply nozzle in the radial direction of the substrate W. The dried substrate W is removed from the drying device 3 by a transporting device (not shown) while the substrate W is in a dried state.

In the present embodiment, the two liquid supply devices 6A and 6B are provided. It is noted, however, the number of liquid supply devices can change depending on the substrate processing method, and therefore the number of liquid supply devices is not limited to this embodiment.

Next, the first liquid supply device 6A and the second liquid supply device 6B will be described in detail. The first liquid supply device 6A and the second liquid supply device 6B have the same configurations, but are different in that the first liquid supply device 6A uses the chemical liquid as a liquid, whereas the second liquid supply device 6B uses the pure water as a liquid.

The first liquid supply device 6A includes an inert-gas dissolving device 31A configured to dissolves the inert gas in the chemical liquid at not less than a saturation solubility to replace the oxygen dissolved in the chemical liquid with the inert gas, and a bubble generating device 32A configured to generate bubbles of the inert gas in the chemical liquid by reducing the pressure of the chemical liquid. The inert-gas dissolving device 31A is coupled to an inert-gas line 33A, so that the inert gas is supplied from an inert-gas supply source 35 to the inert-gas dissolving device 31A through the inert-gas line 33A. The first liquid supply device 6A includes a pressure regulator 37A coupled to the inert-gas line 33A, so that the pressure of the inert gas supplied to the inert-gas dissolving device 31A is regulated by the pressure regulator 37A.

The inert-gas supply source 35 may be an inert-gas supply source as a utility facility of a factory in which the substrate processing apparatus is installed, or may be an inert-gas tank containing the inert gas. Examples of the inert gas include nitrogen gas and rare gas (e.g., argon gas, helium gas, neon gas, etc). The pressure of the inert gas supplied to the inert-gas dissolving device 31A may vary depending on a flow rate of the chemical liquid and the pure water to be supplied, and may be in a range of 1 to 10 atm in gauge pressure and is higher than the supply pressure of the chemical liquid and the pure water.

The inert-gas dissolving device 31A and the bubble generating device 32A are coupled by a first liquid delivery line 40A. The first liquid delivery line 40A is coupled to a chemical-liquid supply source (not shown). The chemical-liquid supply source may be a chemical-liquid supply source as a utility facility of the factory in which the substrate processing apparatus is installed, or may be a chemical-liquid tank in which the chemical liquid is stored. The chemical liquid is sent from the chemical-liquid supply source to the first liquid delivery line 40A with a supply pressure higher than 1 atm.

The inert-gas dissolving device 31A is configured to dissolve the inert gas in the chemical liquid at not less than a saturation solubility. The saturation solubility of the inert gas as defined in this specification is a saturation solubility under conditions of a temperature of 20° C. and 1 atm. Specific configurations of the inert-gas dissolving device 31A are not particularly limited, but for example, the inert-gas dissolving device 31A may be configured to perform bubbling of the inert gas in the chemical liquid, or may use a gas dissolving membrane to dissolve the inert gas in the chemical liquid. Since the pressure of the chemical liquid sent from the chemical-liquid supply source to the first liquid delivery line 40A is higher than 1 atm, the inert gas is dissolved in the chemical liquid in a supersaturated state. As the inert gas is dissolved in the chemical liquid, the oxygen dissolved in the chemical liquid is expelled by the inert gas (i.e., replaced with the inert gas). In other words, the higher the concentration of the inert gas in the chemical liquid, the lower the concentration of the oxygen dissolved in the chemical liquid.

The bubble generating device 32A is configured to generate bubbles of the inert gas in the chemical liquid by depressurizing the chemical liquid in which the inert gas has been dissolved. The bubble generating device 32A is configured to be able to reduce the pressure of the chemical liquid to a lower limit of the pressure that can allow the chemical liquid to be supplied to the primary cleaning device 1A and the secondary cleaning device 1B located downstream of the bubble generating device 32A. Configurations of the bubble generating device 32A are not particularly limited as long as the pressure of the chemical liquid can be reduced. For example, the bubble generating device 32A may be configured to reduce the pressure of the chemical liquid by exposing the chemical liquid in which the inert gas is dissolved to a reduced pressure atmosphere. Diameters of the bubbles can be controlled by a target pressure to be depressurized by the bubble generating device 32A. The diameters of the bubbles generated by the bubble generating device 32A are not more than 1 μm. The diameters of the bubbles can also be controlled by the pressure regulator 37A to some extent.

The first liquid delivery line 40A is coupled to the first inert-gas-dissolved liquid supply line 14. The chemical liquid containing the bubbles of the inert gas is sent to the primary cleaning device 1A and the secondary cleaning device 1B through the first inert-gas-dissolved liquid supply line 14. The first liquid supply device 6A includes a flow-rate regulator 42A configured to regulate a flow rate of the chemical liquid. The flow-rate regulator 42A is coupled to the first liquid delivery line 40A and is arranged downstream of the bubble generating device 32A. The flow rate of the chemical liquid containing the bubbles of the inert gas is regulated by the flow-rate regulator 42A. In order to prevent malfunction of the flow-rate regulator 42A due to the gas bubbles, in one embodiment, the flow-rate regulator 42A may be arranged upstream of the inert-gas dissolving device 31A.

The bubbles contained in the chemical liquid can hinder the dissolution of oxygen in the atmosphere in the chemical liquid, and can therefore maintain a low concentration of oxygen dissolved in the chemical liquid. If the diameters of the bubbles are too large, particles may be attached, or a contact rate of the chemical liquid with the substrate W may decrease, or effect of erosion when the bubbles collapse may increase. Therefore, the diameters of the bubbles must be controlled and 1 μm is preferable. Generally, when the diameters of the bubbles are large, the bubbles collapse in a very short time, and a duration of the concentration of the inert gas dissolved in the chemical liquid is short. In contrast, in the case of bubbles with the diameter of 1 μm, the bubbles are less likely to collapse and an amount of bubbles mixed in the chemical liquid can be maintained for a certain period of time, so that the concentration of the inert gas dissolved in the chemical liquid can be maintained.

The first liquid supply device 6A further includes a three-way valve 45A arranged downstream of the bubble generating device 32A, and a drain line 46A coupled to the three-way valve 45A. In the example shown in FIG. 1, the three-way valve 45A is arranged between the bubble generating device 32A and the flow-rate regulator 42A. An inlet of the three-way valve 45A is coupled to the first liquid delivery line 40A, and two outlets of the three-way valve 45A are coupled to the first liquid delivery line 40A and the drain line 46A, respectively. The three-way valve 45A is configured to selectively close one of the two outlets while keeping one inlet open. The three-way valve 45A is an actuator-driven three-way valve driven by an actuator, such as an electric motor or an air cylinder. The three-way valve 45A is coupled to the operation controller 7, and operation of the three-way valve 45A is controlled by the operation controller 7.

The diameters of the bubbles generated by the bubble generating device 32A may not be stable when the operation of the bubble generating device 32A is started. In addition, the diameters of the bubbles may not be stable during an interval in which the substrate is not cleaned, because there is no flow of the chemical liquid. Therefore, the operation controller 7 instructs the three-way valve 45A to switch the delivery destination of the chemical liquid to the drain line 46A at a time of starting the bubble generating device 32A and/or at the interval in which the substrate is not cleaned, so that the chemical liquid is discharged through the drain line 46A for a preset time before the chemical liquid is supplied to the cleaning devices 1A and 1B. After the preset time has elapsed, the operation controller 7 instructs the three-way valve 45A to switch the delivery destination of the chemical liquid from the drain line 46A to the first liquid delivery line 40A to thereby supply the chemical liquid containing the bubbles to the cleaning devices 1A and 1B. Such operations make it possible to supply the chemical liquid having stable diameters of the bubbles and a stable amount of bubbles mixed in the chemical liquid.

The second liquid supply device 6B has the same configurations as the first liquid supply device 6A described above. The second liquid supply device 6B includes an inert-gas dissolving device 31B, a bubble generating device 32B, an inert-gas line 33B, a second liquid delivery line 40B, a pressure regulator 37B, a three-way valve 45B, a drain line 46B, and a flow-rate regulator 42B, which are correspond to the inert-gas dissolving device 31A, the bubble generating device 32A, the inert-gas line 33A, the first liquid delivery line 40A, the pressure regulator 37A, the three-way valve 45A, the drain line 46A, and the flow-rate regulator 42A of the first liquid supply device 6A, respectively. The above descriptions of the first liquid supply device 6A and the above descriptions (diameters of the bubbles, etc.) in the case of the chemical liquid are applied to the second liquid supply device 6B and the case of the pure water as well, and repetitive descriptions are omitted.

The second liquid delivery line 40B is coupled to a pure-water supply source (not shown). The pure-water supply source may be a pure-water supply source as a utility facility of the factory in which the substrate processing apparatus is installed, or may be a pure-water tank in which the pure water is stored. The pure water is sent from the pure-water supply source to the second liquid delivery line 40B with a supply pressure higher than 1 atm. The second liquid delivery line 40B is coupled to a second inert-gas-dissolved liquid supply line 15. The pure water containing bubbles of the inert gas flows through the second inert-gas-dissolved liquid supply line 15 to the primary cleaning device 1A, the secondary cleaning device 1B, the substrate transporting device 5A, the substrate transporting device 5B, and the drying device 3. The bubble generating device 32B is configured to be able to reduce the pressure of the pure water to a lower limit of the pressure that can allow the pure water to be supplied to the primary cleaning device 1A, the secondary cleaning device 1B, the substrate transporting device 5A, the substrate transporting device 5B, and the drying device 3 which are arranged downstream of the bubble generating device 32B.

As well as the first liquid supply device 6A, the operation controller 7 instructs the three-way valve 45B to switch the delivery destination of the pure water to the drain line 46B at a time of starting the bubble generating device 32B and/or at the interval in which the substrate is not cleaned, so that the pure water is discharged through the drain line 46B for a preset time before the pure water is supplied to the cleaning devices 1A and 1B. After the preset time has elapsed, the operation controller 7 instructs the three-way valve 45B to switch the delivery destination of the pure water from the drain line 46B to the second liquid delivery line 40B to thereby supply the pure water containing the bubbles to the cleaning devices 1A and 1B.

The primary cleaning device 1A and the secondary cleaning device 1B supply the chemical liquid and the pure water to the surface of the substrate W to form a film of the chemical liquid and a film of the pure water on the surface of the substrate W. The chemical liquid and the pure water contain the inert gas dissolved at a solubility equal to or higher than the saturation solubility, and contain the bubbles of the inert gas therein. Therefore, the film of the chemical liquid and the film of the pure water block the oxygen in the ambient atmosphere and can therefore suppress the corrosion of the conductive material (for example, interconnect metal, such as copper) exposed on the surface of the substrate W. Similarly, in the drying device 3, a film of the pure water containing the bubbles of the inert gas is formed on the surface of the substrate W, and can therefore suppress the corrosion of the conductive material exposed on the surface of the substrate W.

Further, according to the present embodiment, a film of the pure water containing the bubbles of the inert gas is formed on the surface of the substrate W during the transporting of the substrate W between the primary cleaning device 1A and the secondary cleaning device 1B and between the secondary cleaning device 1B and the drying device 3. Therefore, the film of the pure water containing the bubbles of the inert gas can suppress the corrosion of the conductive material exposed on the surface of the substrate W during the transporting of the substrate W.

Figure 3A:
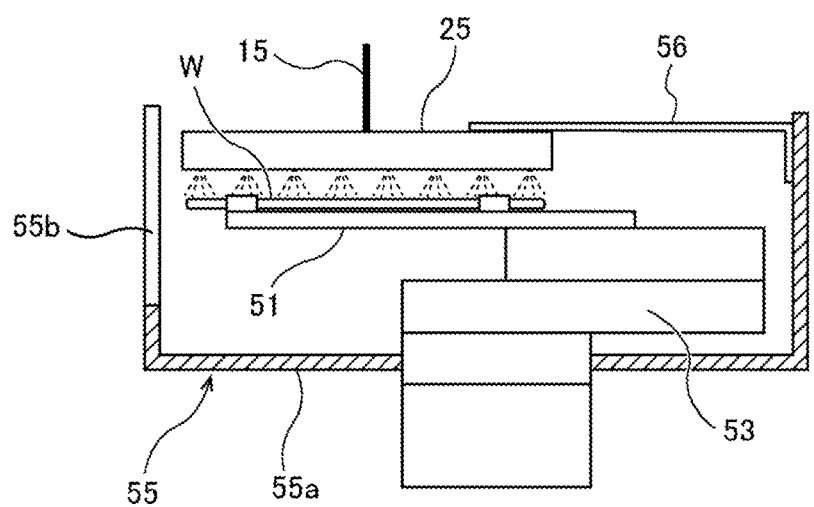
FIGS. 3A to 3C are side views showing an embodiment of a substrate transporting device.
Figure 3B:
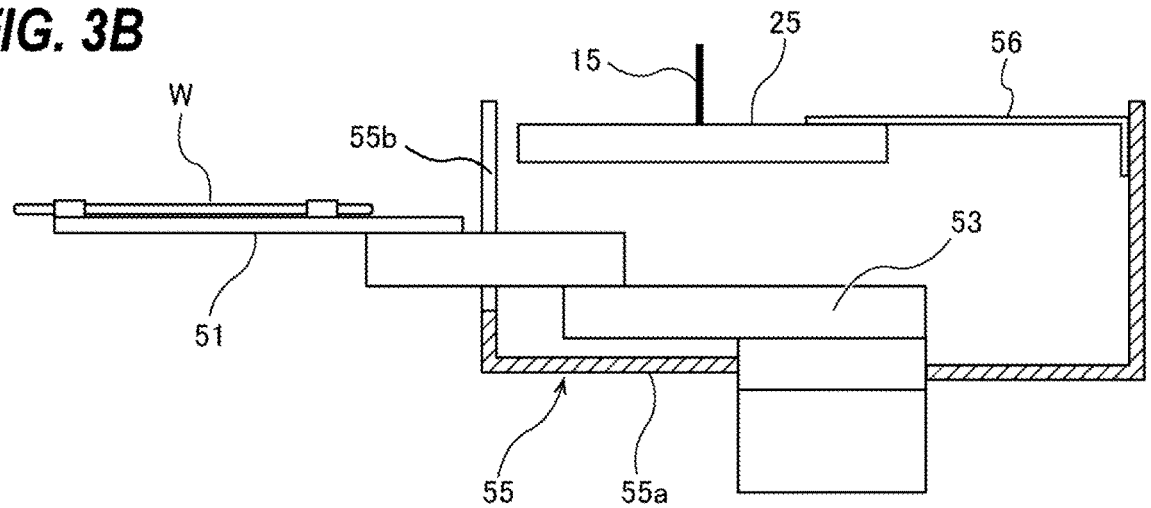
Figure 3C:
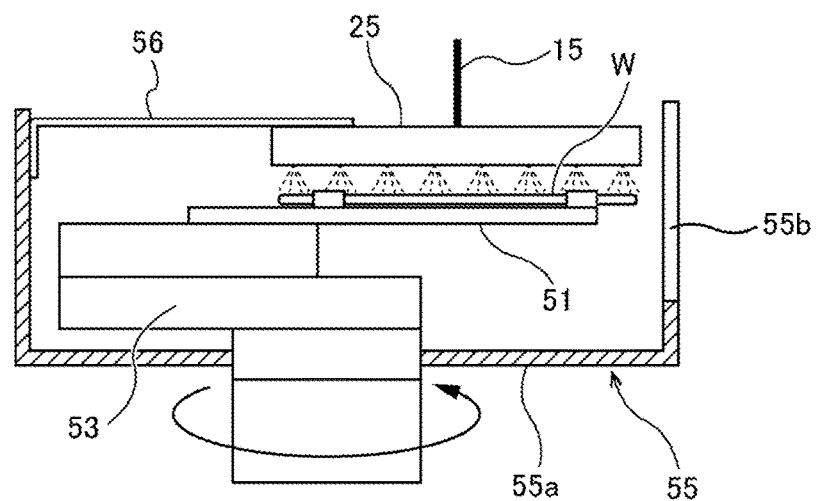

The substrate transporting device 5A and the substrate transporting device 5B have substantially the same configurations, and the substrate transporting device 5A will be described below. FIGS. 3A to 3C are side views showing an embodiment of the substrate transporting device 5A. As shown in FIG. 3A, the substrate transporting device 5A includes a robot hand 51 configured to support the substrate W, a moving mechanism 53 configured to move the robot hand 51, a liquid receiving container 55 coupled to the moving mechanism 53, and the shower nozzle 25 located above the robot hand 51. FIGS. 3A to 3C show a cross section of the liquid receiving container 55. At least a bottom 55a of the liquid receiving container 55 is located below the shower nozzle 25 and the robot hand 51. In the present embodiment, the shower nozzle 25 is located in the liquid receiving container 55.

The moving mechanism 53 is configured to move the robot hand 51 in a horizontal direction and a vertical direction, and to rotate the robot hand 51 horizontally. The liquid receiving container 55 is coupled to the moving mechanism 53 so as to rotate together with the robot hand 51 and move in the vertical direction together with the robot hand 51, while the liquid receiving container 55 does not move horizontally together with the robot hand 51. The liquid receiving container 55 has a cut-out portion 55b that allows the robot hand 51 to move horizontally outside the liquid receiving container 55. The shower nozzle 25 is fixed to the liquid receiving container 55. More specifically, the shower nozzle 25 is fixed to the liquid receiving container 55 via a coupling member 56. The shower nozzle 25 may be directly fixed to the liquid receiving container 55. The shower nozzle 25 rotates and moves in the vertical direction together with the liquid receiving container 55, but does not move in the horizontal direction together with the robot hand 51. In other words, the relative position of the shower nozzle 25 and the liquid receiving container 55 is fixed.

The second inert-gas-dissolved liquid supply line 15 extending from the second liquid supply device 6B is coupled to the shower nozzle 25, and the pure water in which the inert gas is dissolved (including the bubbles of the inert gas) is supplied to the shower nozzle 25. The shower nozzle 25 has a plurality of liquid discharge openings in a lower surface thereof. The pure water in which the inert gas is dissolved is supplied from the shower nozzle 25 to the entire upper surface of the substrate W on the robot hand 51.

As shown in FIG. 3B, when the substrate transporting device 5A is receiving the substrate W, the robot hand 51 extends out of the liquid receiving container 55 through the cut-out portion 55b. Once the robot hand 51 receives the substrate W, the robot hand 51 returns to a reference position (a position shown in FIG. 3A) in the liquid receiving container 55. The shower nozzle 25 is located above the robot hand 51 at the reference position. Therefore, when the robot hand 51 is in the reference position, the shower nozzle 25 supplies the pure water in which the inert gas is dissolved to the entire upper surface of the substrate W on the robot hand 51. The pure water is collected in the liquid receiving container 55 and discharged from the liquid receiving container 55.

When the substrate transporting device 5A is transporting the substrate W from the primary cleaning device 1A to the secondary cleaning device 1B, the robot hand 51 is rotated by the moving mechanism 53 while the robot hand 51 is located in the liquid receiving container 55 as shown in FIG. 3C. Since the shower nozzle 25 is rotated together with the robot hand 51, the shower nozzle 25 continues to supply the pure water in which the inert gas is dissolved (including the bubbles of the inert gas) to the entire upper surface of the substrate W on the robot hand 51 while the robot hand 51 is rotating. In this way, by supplying the pure water containing the bubbles of the inert gas at the time of transporting the substrate, the liquid film on the surface of the substrate is maintained. The pure water in which the inert gas is dissolved can block the oxygen in the atmosphere, and can therefore suppress the corrosion of the conductive material during the transporting of the substrate.

From the viewpoint of suppressing the corrosion of the conductive material, it is desirable to remove the dissolved oxygen in the chemical liquid and the pure water as much as possible. Therefore, in one embodiment shown in FIG. 4, the first liquid supply device 6A and the second liquid supply device 6B further include deaeration devices 60A and 60B for deaerating the liquids (i.e., the chemical liquid and the pure water in the embodiment shown in FIG. 4). The deaeration device 60A of the first liquid supply device 6A is coupled to the first liquid delivery line 40A and is arranged upstream of the inert-gas dissolving device 31A. The deaeration device 60A deaerates the chemical liquid (i.e., removes oxygen from the chemical liquid) before the inert gas is dissolved in the chemical liquid by the inert-gas dissolving device 31A. The deaeration device 60B of the second liquid supply device 6B is coupled to the second liquid delivery line 40B and is arranged upstream of the inert-gas dissolving device 31B. The deaeration device 60B deaerates the pure water (i.e., removes oxygen from the pure water) before the inert gas is dissolved in the pure water by the inert-gas dissolving device 31B. The embodiment of FIG. 4 can remove the dissolved oxygen in the chemical liquid and the pure water as much as possible.

In general, dissolution of a gas in a liquid follows Henry's law. Specifically, an amount of gas that can be dissolved in a liquid at a certain temperature is almost directly proportional to a partial pressure of the gas. Therefore, the solubility increases in approximately proportion to the pressure of the gas to be dissolved (or partial pressure in a case of a plurality of gases). Under a condition of constant atmospheric pressure, the solubility of the gas depends on the temperature.

FIG. 5 shows dissolved amount ($cm^3$) per 1 $cm^3$ of water under 1 atm with respect to oxygen and typical inert gases. As shown in FIG. 5, the only gas having a higher solubility than oxygen under the same pressure is argon gas, and other inert gases have lower solubilities. In this case, under 1 atm condition, the oxygen may be dissolved again depending on the partial pressures of nitrogen and oxygen in the atmosphere.

Figure 6:
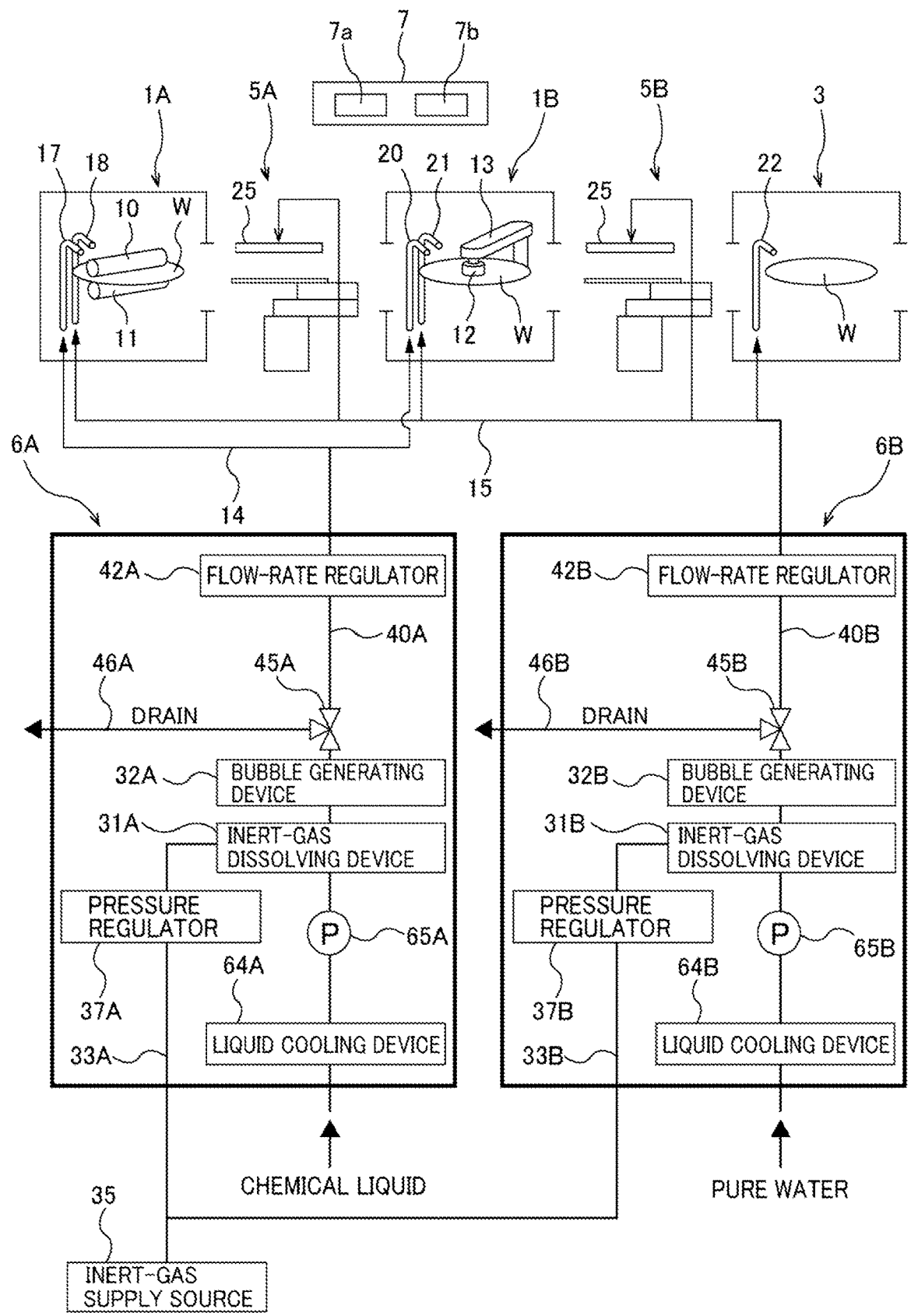
FIG. 6 is a schematic view showing still another embodiment of the substrate processing apparatus.

Therefore, in an embodiment described below, the solubility of the inert gas is increased by pressurizing the inert gas to be dissolved and lowering the temperature of the liquids as solvents (i.e., the chemical liquid and the pure water in the following examples). As shown in FIG. 6, the first liquid supply device 6A and the second liquid supply device 6B further include liquid cooling devices 64A, 64B configured to cool the liquids (i.e., the chemical liquid and the pure water in the embodiment of FIG. 8) before the inert gas is dissolved in the liquids, and pumps 65A, 65B configured to pressurize the liquids before the inert gas is dissolved in the liquids. More specifically, the first liquid supply device 6A includes the liquid cooling device 64A and the pump 65A coupled to the first liquid delivery line 40A. The second liquid supply device 6B also includes the liquid cooling device 64B and the pump 65B coupled to the second liquid delivery line 40B.

The liquid cooling device 64A and the pump 65A are arranged upstream of the inert-gas dissolving device 31A. The liquid cooling device 64A cools the chemical liquid before the inert gas is dissolved in the chemical liquid by the inert-gas dissolving device 31A. A target temperature of the chemical liquid to be cooled is set in advance. For example, the target temperature is higher than 0° C. in order to avoid freezing of the chemical liquid and lower than a room temperature. For example, the liquid cooling device 64A is configured to cool the chemical liquid to a temperature in a range of 5° C. to 20° C.

The pump 65A pressurizes the chemical liquid before the inert gas is dissolved in the chemical liquid by the inert-gas dissolving device 31A. More specifically, the pump 65A pressurizes the chemical liquid to a pressure higher than the supply pressure of the chemical liquid sent from the chemical-liquid supply source. A target pressure of the chemical liquid to be pressurized is set in advance, and is, for example, within a pressure range corresponding to 1 to 10 atm in gauge pressure.

In the embodiment shown in FIG. 6, the liquid cooling device 64A is arranged upstream of the pump 65A, but as long as both the liquid cooling device 64A and the pump 65A are arranged upstream of the inert-gas dissolving device 31A, the liquid cooling device 64A may be arranged downstream of the pump 65A.

Figure 7:
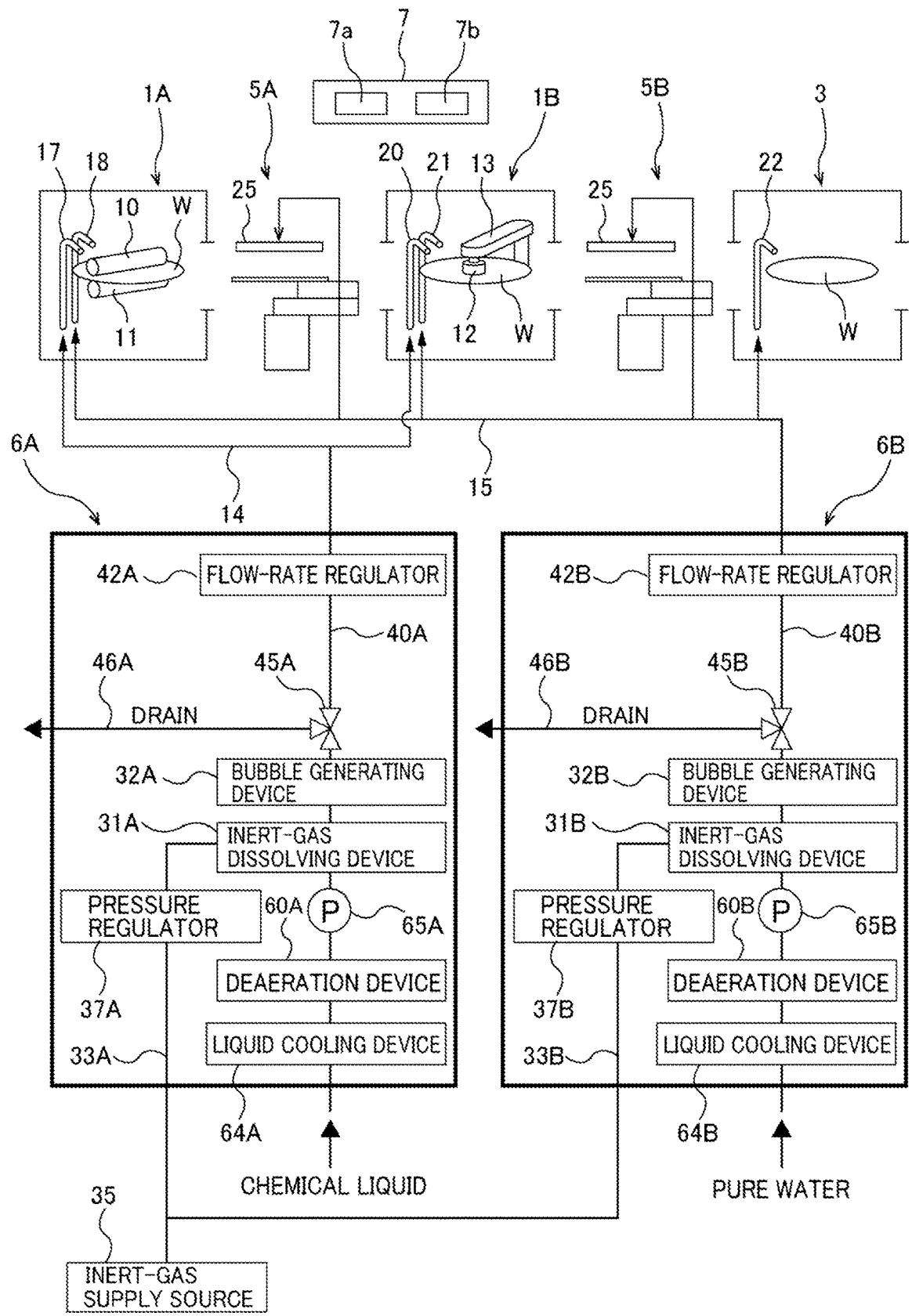
FIG. 7 is a schematic view showing still another embodiment of the substrate processing apparatus.

Since configurations and arrangements of the liquid cooling device 64B and the pump 65B of the second liquid supply device 6B are the same as those of the liquid cooling device 64A and the pump 65A of the first liquid supply device 6A described above, repetitive descriptions thereof are omitted. This embodiment can increase the solubility of the inert gas having a low solubility, and the oxygen removing effect is increased. The deaeration devices 60A and 60B shown in FIG. 4 can also be applied to the embodiment shown in FIG. 6. For example, as shown in FIG. 7, the deaeration device 60A may be arranged between the liquid cooling device 64A and the pump 65A, and the deaeration device 60B may be arranged between the liquid cooling device 64B and the pump 65B.

Figure 8:
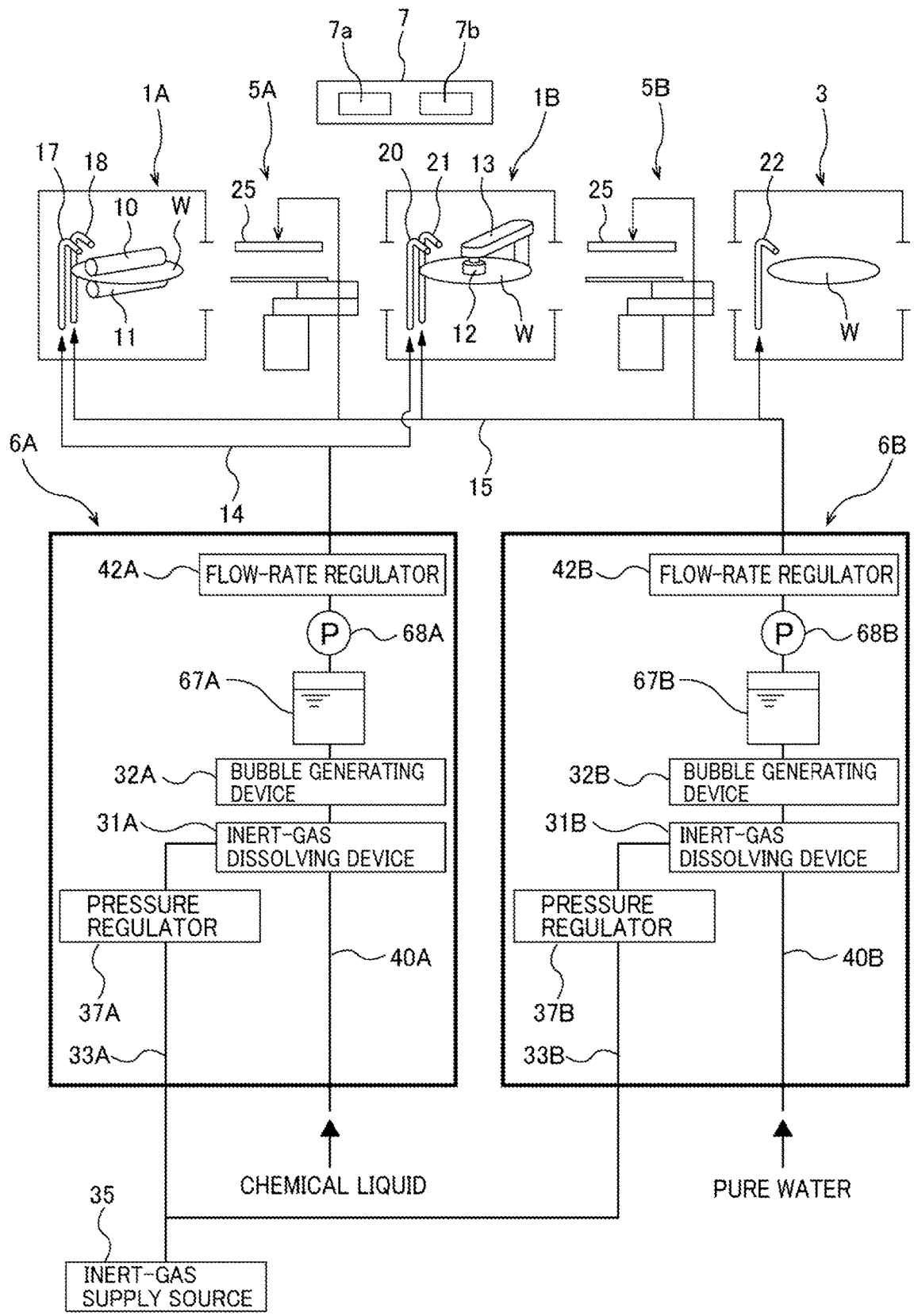
FIG. 8 is a schematic view showing still another embodiment of the substrate processing apparatus.

FIG. 8 is a schematic view showing another embodiment of the substrate processing apparatus. Configurations and operations of the present embodiment, which will not be particularly described, are the same as those of the above-described embodiments described with reference to FIGS. 1 and 3, and repetitive descriptions thereof will be omitted. As shown in FIG. 8, in the present embodiment, the first liquid supply device 6A and the second liquid supply device 6B further include buffer tanks 67A and 67B for temporarily storing the liquids (i.e., the chemical liquid and the pure water in the embodiment of FIG. 8) containing the bubbles of the inert gas, and auxiliary pumps 68A and 68B for pressurizing the liquids stored in the buffer tanks 67A and 67B. In this embodiment, the three-way valves 45A and 45B and the drain lines 46A and 46B shown in FIG. 1 are not provided.

Configurations and arrangements of the buffer tank 67A and the auxiliary pump 68A are the same as configurations and arrangements of the buffer tank 67B and the auxiliary pump 68B. Therefore, the buffer tank 67A and the auxiliary pump 68A will be described below. The buffer tank 67A and the auxiliary pump 68A are coupled to the first liquid delivery line 40A. The buffer tank 67A is arranged downstream of the bubble generating device 32A, and the auxiliary pump 68A is arranged downstream of the buffer tank 67A. The flow-rate regulator 42A is located downstream of the auxiliary pump 68A. If the auxiliary pump 68A is capable of variable speed operation, the flow-rate regulator 42A may be omitted.

The chemical liquid containing the bubbles generated by the bubble generating device 32A is once stored in the buffer tank 67A. Bubbles having large diameters are likely to collapse, and therefore the large bubbles can be removed, and the diameters of the bubbles and the amount of bubbles mixed become stable. In one embodiment, the inert gas used in the inert-gas dissolving device 31A may be introduced into the buffer tank 67A to pressurize the chemical liquid in the buffer tank 67A with the inert gas. In this case, the auxiliary pump 68A may be omitted.

Figure 4:
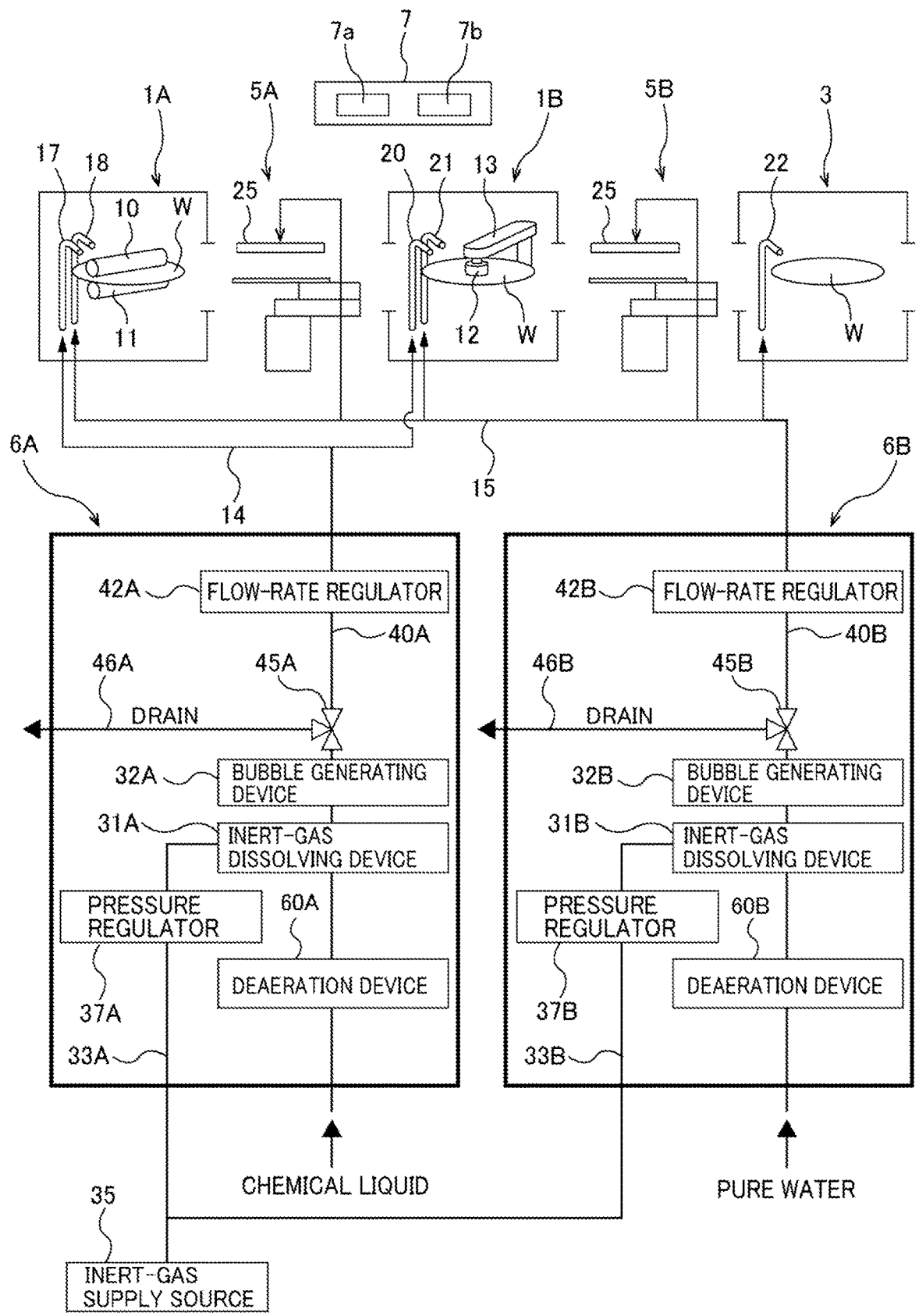
FIG. 4 is a schematic view showing still another embodiment of the substrate processing apparatus.

The deaeration devices 60A and 60B shown in FIG. 4 and/or the liquid cooling devices 64A and 64B and the pumps 65A and 65B shown in FIG. 5 may be applied to the embodiments described with reference to FIG. 8.

Figure 9:
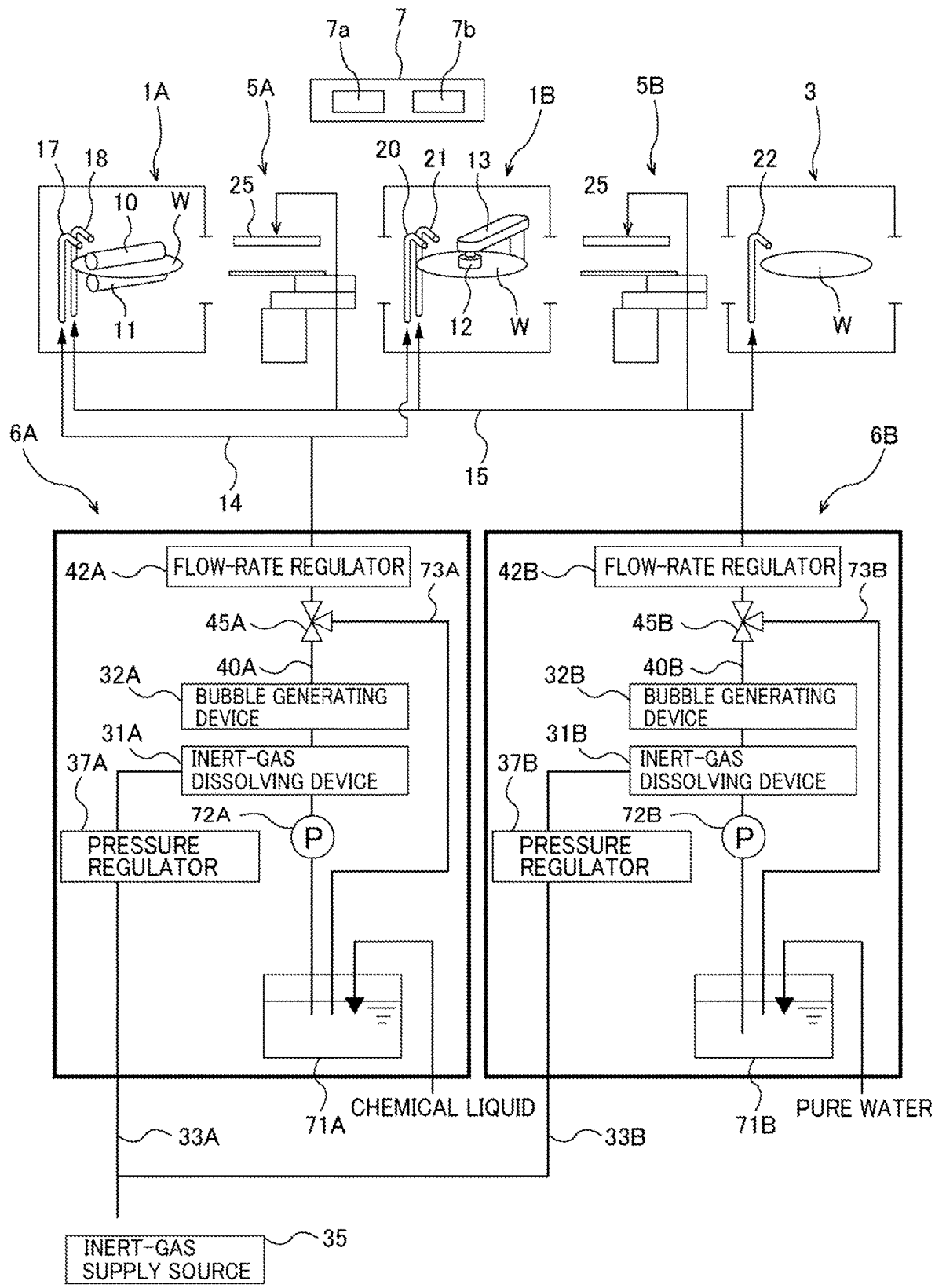
FIG. 9 is a schematic view showing still another embodiment of the substrate processing apparatus.

FIG. 9 is a schematic view showing another embodiment of the substrate processing apparatus. Configurations and operations of the present embodiment, which will not be particularly described, are the same as those of the above-described embodiments described with reference to FIGS. 1 and 3, and repetitive descriptions thereof will be omitted. As shown in FIG. 9, in the present embodiment, the first liquid supply device 6A and the second liquid supply device 6B further include liquid tanks 71A and 71B arranged upstream of the inert-gas dissolving devices 31A and 31B, pumps 72A and 72B configured to deliver the liquids (i.e., the chemical liquid and the pure water in the embodiment of FIG. 9) stored in the liquid tanks 71A and 71B to the inert-gas dissolving devices 31A and 31B, and circulation lines 73A and 73B arranged to return the liquids containing the bubbles to the liquid tanks 71A and 71B. The circulation lines 73A and 73B extend from positions downstream of the bubble generating devices 32A and 32B to the liquid tanks 71A and 71B.

The first liquid supply device 6A and the second liquid supply device 6B have the same configurations. Therefore, the first liquid supply device 6A will be described below. The liquid tank 71A is coupled to the first liquid delivery line 40A. The liquid tank 71A is located upstream of the inert-gas dissolving device 31A and the bubble generating device 32A. The chemical liquid supplied from the chemical-liquid supply source (not shown) is once stored in the liquid tank 71A. The pump 72A is coupled to the first liquid delivery line 40A and is located between the liquid tank 71A and the inert-gas dissolving device 31A. When the pump 72A is operated, the chemical liquid stored in the liquid tank 71A is pressurized and delivered to the inert-gas dissolving device 31A.

The circulation line 73A is coupled to the first liquid delivery line 40A at a position downstream of the bubble generating device 32A. More specifically, the circulation line 73A is coupled to one of the two outlets of the three-way valve 45A instead of the drain line of FIG. 1. Specifically, the inlet of the three-way valve 45A is coupled to the first liquid delivery line 40A, and the two outlets of the three-way valve 45A are coupled to the first liquid delivery line 40A and the circulation line 73A, respectively.

The diameters of the bubbles generated by the bubble generating device 32A may not be stable when the bubble generating device 32A is started. In addition, the diameters of the bubbles may not be stable during the interval in which the substrate is not cleaned, because there is no flow of the chemical liquid. Therefore, the operation controller 7 instructs the three-way valve 45A to switch the delivery destination of the chemical liquid to the circulation line 73A at the time of starting the bubble generating device 32A and/or at the interval in which the substrate is not cleaned, so that the chemical liquid is returned to the liquid tank 71A through the circulation line 73A for a preset time before the chemical liquid is supplied to the cleaning devices 1A and 1B. The process of dissolving the inert gas in the liquid at not less than the saturation solubility and the process of generating the bubbles of the inert gas in the chemical liquid are repeated while the chemical liquid is circulating via the liquid tank 71A, the inert-gas dissolving device 31A, the bubble generating device 32A, and the circulation line 73A. After the preset time has elapsed, the operation controller 7 instructs the three-way valve 45A to switch the delivery destination of the chemical liquid from the circulation line 73A to the first liquid delivery line 40A to thereby supply the chemical liquid containing the bubbles to the cleaning devices 1A and 1B. These operations make it possible to supply the chemical liquid having stable diameters of the bubbles and the stable amount of bubbles mixed.

Configurations and arrangements of the liquid tank 71B, the pump 72B, and the circulation line 73B of the second liquid supply device 6B are the same as the configurations and the arrangements of the liquid tank 71A, the pump 72A, and the circulation line 73A of the first liquid supply device 6A. Therefore, repetitive explanations thereof will be omitted.

The present embodiment is suitable when the supply pressure of the chemical liquid supplied from the chemical-liquid supply source (not shown) and the supply pressure of the pure water supplied from the pure-water supply source (not shown) are low, or when the flow rates of the chemical liquid and the pure water used in cleaning of the substrate W and drying of the substrate W are high. In addition, as the circulations of the chemical liquid and the pure water are repeated, large-diameter bubbles among the bubblies generated can be eliminated during the circulations. As a result, the chemical liquid and the pure water having more stable diameters of the bubbles and more stable amount of bubbles mixed can be supplied.

Figure 10:
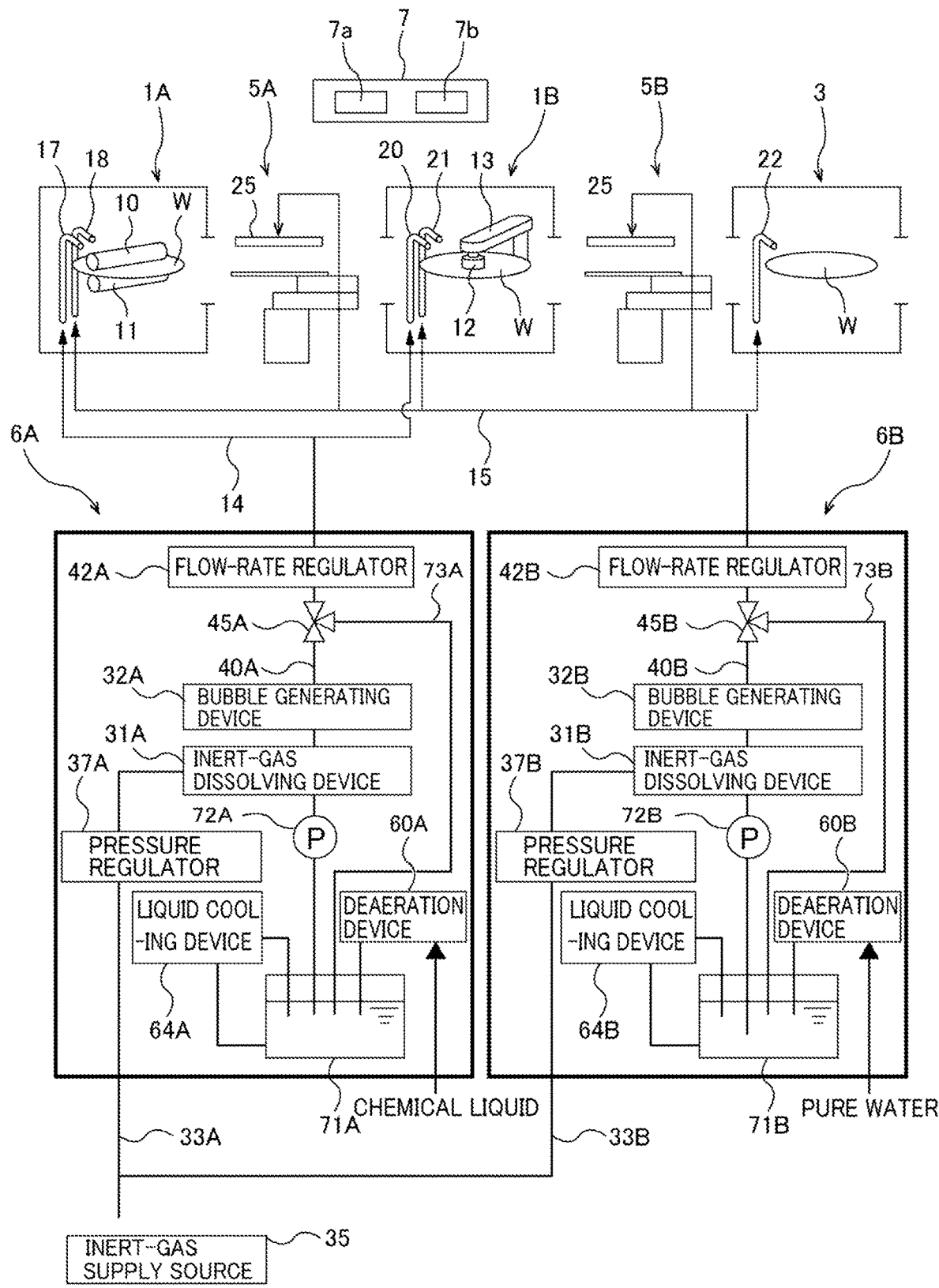
FIG. 10 is a schematic view showing still another embodiment of the substrate processing apparatus.

The above-described embodiments can be combined as appropriate. For example, as shown in FIG. 10, the deaeration devices 60A and 60B shown in FIG. 4 and the liquid cooling devices 64A and 64B shown in FIG. 6 may be applied to the embodiments described with reference to FIG. 9. In the embodiment shown in FIG. 10, the deaeration device 60A and the liquid cooling device 64A are coupled to the liquid tank 71A. The chemical liquid is supplied to the liquid tank 71A via the deaeration device 60A and the liquid cooling device 64A cools the chemical liquid in the liquid tank 71A. Similarly, the deaeration device 60B and the liquid cooling device 64B are coupled to the liquid tank 71B. The pure water is supplied to the liquid tank 71B via the deaeration device 60B, and the liquid cooling device 64B cools the pure water in the liquid tank 71B.

The substrate W to be processed in the embodiments described with reference to FIGS. 1 to 10 is a substrate having a conductive material exposed on its surface. Specific examples of such substrate W include a substrate W polished by a CMP apparatus. The substrate processing apparatus according to the following embodiment includes a CMP device (chemical mechanical polishing device) for chemically and mechanically polishing the substrate W, in addition to the cleaning devices 1A, 1B, the drying device 3, the substrate transporting devices 5A, 5B, the first liquid supply device 6A, and the second liquid supply device 6B.

Figure 11:
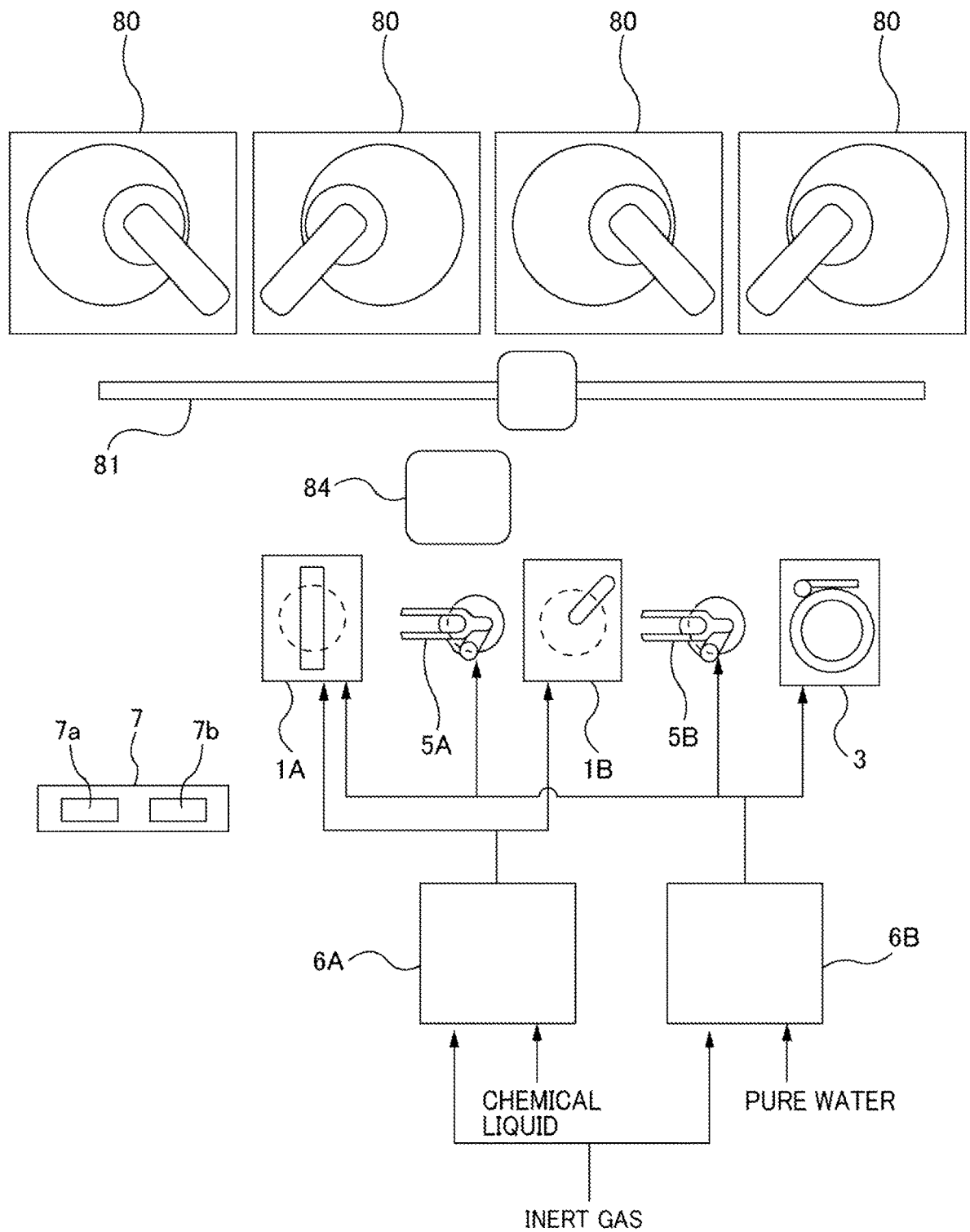
FIG. 11 is a schematic view showing still another embodiment of the substrate processing apparatus.

FIG. 11 is a schematic view showing an embodiment of the substrate processing apparatus including the CMP device (chemical mechanical polishing device). First liquid supply device 6A and second liquid supply device 6B shown in FIG. 11 are the first liquid supply device 6A and the second liquid supply device 6B of any one of the embodiments described with reference to FIGS. 1 to 10. As shown in FIG. 11, the substrate processing apparatus includes a plurality of CMP devices 80 each configured to chemically and mechanically polish the substrate W, and a transporter 81 configured to transport the substrate W to one of these CMP devices 80 and remove the polished substrate W.

Figure 12:
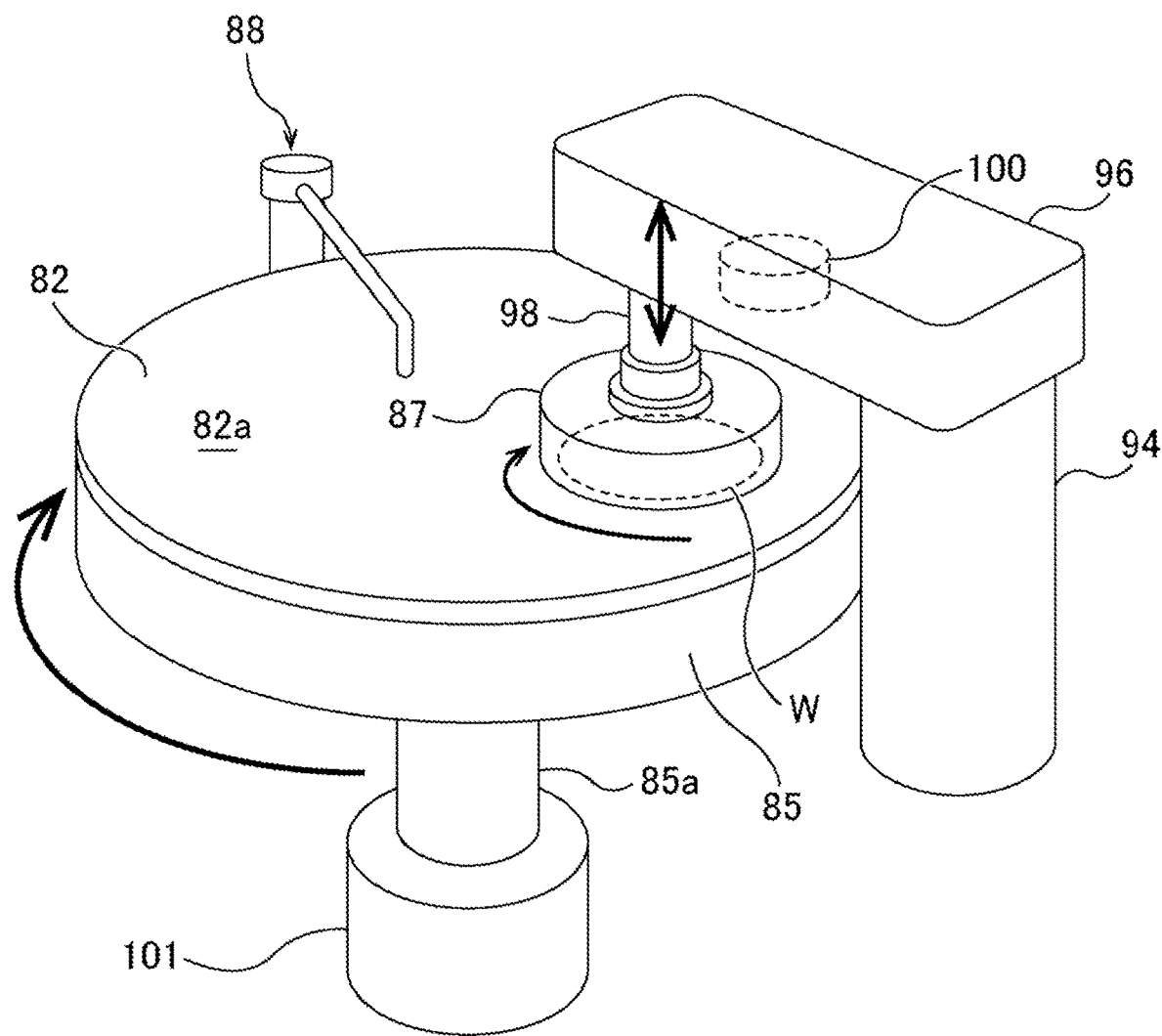
FIG. 12 is a perspective view schematically showing an embodiment of a CMP apparatus.

The plurality of CMP devices 80 have the same configuration. FIG. 12 is a perspective view schematically showing an embodiment of the CMP device 80. The CMP device 80 includes a polishing table 85 configured to support a polishing pad 82 having a polishing surface 82a, a polishing head 87 configured to press the substrate W to be polished against the polishing surface 82a, and a polishing-liquid supply nozzle 88 configured to supply a polishing liquid onto the polishing surface 82a. The polishing liquid is typically slurry containing abrasive grains.

The polishing head 87 is configured to be able to hold the substrate W on its lower surface by vacuum suction or the like. Each CMP device 80 includes a support shaft 94, a polishing-head oscillation arm 96 coupled to an upper end of the support shaft 94 and configured to oscillate the polishing head 87, a polishing-head shaft 98 rotatably supported by a free end of the polishing-head oscillation arm 96, and a polishing-head rotating device 100 for rotating the polishing head 87 about its axis. The polishing-head rotating device 100 is fixed to the polishing-head oscillation arm 96, and is coupled to the polishing-head shaft 98 via a torque transmission mechanism (not shown) composed of a belt, pulleys, etc. The polishing head 87 is coupled to a lower end of the polishing-head shaft 98. The polishing-head rotating device 100 rotates the polishing-head shaft 98 via the torque transmission mechanism, and the polishing head 87 rotates together with the polishing-head shaft 98. In this way, the polishing head 87 is rotated about the axis thereof by the polishing-head rotating device 100 in a direction indicated by arrow. Specific examples of the polishing-head rotating device 100 include an electric motor.

The polishing-head shaft 98 can be moved up and down relative to the polishing-head oscillation arm 96 by an elevating mechanism (not shown), so that the polishing head 87 can be moved up and down relative to the polishing-head oscillation arm 96 by the vertical movement of the polishing-head shaft 98.

The CMP device 80 further includes a polishing-table rotating device 101 configured to rotate the polishing pad 82 and the polishing table 85 about their axes. The polishing table 85 is coupled to the polishing-table rotating device 101 via a table shaft 85a. The polishing table 85 and the polishing pad 82 are rotated about the table shaft 85*a* by the polishing-table rotating device 101 in a direction indicated by arrow. The polishing pad 82 is attached to an upper surface of the polishing table 85. An upper surface of the polishing pad 82 provides the polishing surface 82*a* for polishing the substrate W. Specific examples of the polishing-table rotating device 101 include an electric motor.

Polishing of the substrate W is performed as follows. While the polishing head 87 and the polishing table 85 are rotated, the polishing liquid is supplied from the polishing-liquid supply nozzle 88 onto the polishing surface 82*a* of the polishing pad 82. The polishing pad 82 rotates about its axis together with the polishing table 85. The polishing head 87 is lowered to a predetermined polishing position by the elevating mechanism (not shown). Further, the polishing head 87 presses the substrate W against the polishing surface 82*a* of the polishing pad 82 at the above polishing position with a predetermined pressure. The substrate W is in sliding contact with the polishing surface 82*a* of the polishing pad 82 in the presence of the polishing liquid on the polishing surface 82*a* of the polishing pad 82. The surface of the substrate W is polished by a combination of a chemical action of the polishing liquid supplied to the polishing surface 82*a* and a mechanical action of the abrasive grains contained in the polishing liquid and/or the polishing pad 82.

The substrate processing apparatus shown in FIG. 11 is a composite processing apparatus configured to polish, cleans and dry the substrate W. The substrate W is processed by the substrate processing apparatus shown in FIG. 11 as follows. The substrate W to be polished is carried to the transporter 81 by a transfer robot (not shown). The transporter 81 transports the substrate W to one of the plurality of CMP devices 80, and the CMP device 80 polishes the substrate W. The polished substrate W is removed from the CMP device 80 by the transporter 81 and is transported to the substrate transporting device 5A via a temporary stage 84. The temporary stage 84 is provided between the transporter 81 and the substrate transporting device 5A. After the transporter 81 places the substrate W on the temporary stage 84, the substrate transporting device 5A removes the substrate W from the temporary stage 84. In the substrate processing apparatus having the CMP devices 80, the chemical liquid or the pure water containing bubbles of the inert gas may be supplied onto the substrate W on the transporter 81 and/or the temporary stage 84 after polishing. The substrate W is further transported into the primary cleaning device 1A by the substrate transporting device 5A. The primary cleaning device 1A scrubs and cleans the surface of the substrate W with the cleaning tool while supplying the chemical liquid supplied from the first liquid supply device 6A and the pure water supplied from the second liquid supply device 6B to the surface of the substrate W. Both the chemical liquid and the pure water are liquids containing the bubbles of the inert gas.

The substrate W cleaned by the primary cleaning device 1A is transported to the secondary cleaning device 1B by the substrate transporting device 5A. During the transporting of the substrate W from the primary cleaning device 1A to the secondary cleaning device 1B, the pure water containing bubbles of the inert gas is supplied onto the substrate W, and a film of the pure water is formed on the substrate W. The secondary cleaning device 1B scrubs and cleans the surface of the substrate W with the cleaning tool while supplying the chemical liquid supplied from the first liquid supply device 6A and the pure water supplied from the second liquid supply device 6B to the surface of the substrate W. Both the chemical liquid and the pure water are liquids containing bubbles of the inert gas.

The substrate W cleaned by the secondary cleaning device 1B is transported to the drying device 3 by the substrate transport device 5B. During the transporting of the substrate W from the secondary cleaning device 1B to the drying device 3, the pure water containing bubbles of the inert gas is supplied onto the substrate W, and a film of the pure water is formed on the substrate W. The drying device 3 supplies the pure water and IPA steam (a mixture of isopropyl alcohol and an inert gas) onto the upper surface of the substrate W from the pure-water supply nozzle and the IPA supply nozzle while moving the pure-water supply nozzle and the IPA supply nozzle in the radial direction of the substrate W to thereby dry the substrate W.

According to the present embodiment, the conductive material (for example, interconnect metal) exposed on the surface of the substrate W polished by the CMP device 80 is covered with the liquid containing bubbles of the inert gas during cleaning, transporting, and drying of the substrate W. Therefore, the corrosion of the conductive material of the substrate W is suppressed. In the present embodiment shown in FIG. 11, four CMP devices 80 are provided, but the number of CMP devices 80 is not limited to this embodiment. In one embodiment, the substrate processing apparatus may include only a single CMP device.

FIG. 11 shows an example of the substrate processing apparatus including the CMP devices 80 provided in front of the cleaning devices and the drying device for the substrate W. The above-described embodiments can also be applied to an example of the substrate processing apparatus including a plating device, an etching device, a bevel polishing device, or the like for the substrate W in front of the cleaning devices and the drying device if it is necessary to suppress corrosion of the conductive material of the substrate W.

The substrate processing apparatus of the embodiments described so far includes two liquid supply devices 6A and 6B, i.e., the first liquid supply device 6A for dissolving the inert gas in the chemical liquid and the second liquid supply device 6B for dissolving the inert gas in the pure water. In one embodiment, the first liquid supply device 6A for dissolving the inert gas in the chemical liquid may be omitted. In this case, the second liquid supply device 6B dissolves the inert gas in the pure water to generate the pure water containing bubbles of the inert gas, and then cleaning chemical components, such as a chelating agent and a pH adjuster, are added to the pure water. As a result, a chemical liquid containing bubbles of the inert gas can be produced.

If the chemical liquid itself contains a corrosion inhibitor that suppresses corrosion of the conductive material and the chemical liquid can be sufficiently removed by washing the substrate W with pure water, the inert gas may not be dissolved in the chemical liquid, and the chemical liquid may be supplied as it is onto the surface of the substrate W. In this case also, the first liquid supply device 6A for dissolving the inert gas in the chemical liquid may be omitted.

In the embodiments described so far, the chemical liquid and the pure water are used as liquids, but the present invention can be applied to liquid other than the chemical liquid and the pure water.

The operations of the substrate processing apparatus of each of the above-described embodiments is controlled by the operation controller 7. The operation controller 7 is composed of at least one computer. The operation controller 7 operates according to instructions included in the programs electrically stored in the memory 7a. Specifically, the operation controller 7 instructs the substrate processing apparatus to perform the substrate processing method of any of the above-described embodiments. The programs for causing the operation controller 7 to execute such operations are stored in a computer-readable storage medium which is a non-transitory tangible object, and are provided to the operation controller 7 via the storage medium. Alternatively, the programs may be input to the operation controller 7 from a communication device via a communication network, such as the Internet or a local area network.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus, comprising:
   a CMP device configured to polish a substrate by rubbing the substrate against a polishing surface while supplying a polishing liquid onto the polishing surface;
   a cleaning device configured to clean the substrate and having a first liquid supply nozzle configured to supply a liquid onto the substrate, wherein the cleaning device is configured to clean the substrate after the substrate has been polished by the CMP device;
   a drying device configured to dry the substrate and having a second liquid supply nozzle configured to supply the liquid onto the substrate;
   a substrate transporter configured to transport the substrate from the cleaning device to the drying device, wherein the substrate transporter comprises a third liquid supply nozzle configured to supply the liquid onto the substrate while the substrate is transported from the cleaning device to the drying device; and
   a liquid supply device configured to supply the liquid to the first liquid nozzle, the second liquid nozzle, and the third liquid nozzle,
   the liquid supply device including:
   an inert-gas dissolving device configured to dissolve an inert gas in the liquid at not less than a saturation solubility to replace oxygen dissolved in the liquid with the inert gas;
   a liquid cooling device configured to cool the liquid before the inert gas is dissolved in the liquid; and
   a supply line configured to deliver the liquid to the first liquid supply nozzle, the second liquid supply nozzle, and the third liquid supply nozzle, and wherein the supply line is arranged downstream of a bubble generator that is located downstream of the inert-gas dissolving device, and wherein the liquid comprises bubbles of the inert gas when the supply line delivers the liquid to the first liquid supply nozzle, the second liquid supply nozzle, and the third liquid supply nozzle.

2. The substrate processing apparatus according to claim 1, wherein the bubbles have diameters of not more than 1 μm.

3. The substrate processing apparatus according to claim 1, wherein the saturation solubility of the inert gas is a saturation solubility determined under conditions of the liquid at a temperature of 20° C. and 1 atm.

4. The substrate processing apparatus according to claim 1, further comprising a deaerator positioned upstream of the inert-gas dissolving device.

5. The substrate processing apparatus according to claim 1, wherein the liquid cooling device is configured to cool the liquid, before the inert gas is dissolved in the liquid, to a temperature in a range of 5° C. to 20° C.

6. The substrate processing apparatus according to claim 1, further comprising:
   a liquid tank located upstream of the inert-gas dissolving device;
   a pump configured to deliver the liquid stored in the liquid tank to the inert-gas dissolving device; and
   a circulation line extending from a position downstream of the bubble generator to the liquid tank and arranged to return liquid containing bubbles to the liquid tank.

7. The substrate processing apparatus according to claim 1, wherein the inert gas is nitrogen gas or a noble gas.

8. The substrate processing apparatus according to claim 1, wherein the liquid is pure water or chemical liquid.

9. The substrate processing apparatus according to claim 1, wherein the substrate transporter comprises a robot hand configured to support the substrate, and wherein the third liquid supply nozzle is a shower nozzle arranged above the robot hand.

10. The substrate processing apparatus according to claim 1, where the bubble generator depressurizes the liquid in which the inert gas is dissolved.

* * * * *